US010790404B2

(12) United States Patent
Flendrig et al.

(10) Patent No.: US 10,790,404 B2
(45) Date of Patent: Sep. 29, 2020

(54) THERMOPLASTIC VULCANIZATE COMPOSITIONS FOR PHOTOVOLTAIC CELL APPLICATIONS

(71) Applicant: ExxonMobil Chemical Patents Inc., Baytown, TX (US)

(72) Inventors: Joseph G. Flendrig, Roermond (NL); Vincent A. Pirmez, Beaumont (BE); Ulf L. R. Nilsson, Aachen (DE)

(73) Assignee: ExxonMobil Chemical Patents Inc., Baytown, TX (US)

( * ) Notice: Subject to any disclaimer, the term of this patent is extended or adjusted under 35 U.S.C. 154(b) by 0 days.

(21) Appl. No.: 16/079,691

(22) PCT Filed: Feb. 9, 2017

(86) PCT No.: PCT/US2017/017156
§ 371 (c)(1),
(2) Date: Aug. 24, 2018

(87) PCT Pub. No.: WO2017/172055
PCT Pub. Date: Oct. 5, 2017

(65) Prior Publication Data
US 2019/0074394 A1 Mar. 7, 2019

Related U.S. Application Data

(60) Provisional application No. 62/315,329, filed on Mar. 30, 2016.

(30) Foreign Application Priority Data

May 24, 2016 (EP) .................................. 16170982

(51) Int. Cl.
*H01L 31/048* (2014.01)
*C09D 123/08* (2006.01)
(Continued)

(52) U.S. Cl.
CPC .... *H01L 31/0481* (2013.01); *C09D 123/0853* (2013.01); *C09D 123/10* (2013.01);
(Continued)

(58) Field of Classification Search
CPC .... H01L 31/049; H01L 31/0481; H02S 30/20
See application file for complete search history.

(56) References Cited

U.S. PATENT DOCUMENTS 2,972,600 A   2/1961   Braidwood
3,248,179 A   4/1966   Norwood
(Continued)

FOREIGN PATENT DOCUMENTS

CN   101469095 B   1/2013
EP   2 405 489 A   1/2012
(Continued)

OTHER PUBLICATIONS

Kempe, M.D., et al., "Low Cost, Single Layer Replacement for the Back-Sheet and Encapsulant Layers", Conference Paper NREL/CP-520-42795, SPIE PV Reliability Symposium, pp. 1-13, 2008.
(Continued)

*Primary Examiner* — Jayne L Mershon

(57) ABSTRACT

Provided herein are back sheets comprising and/or otherwise made from thermoplastic vulcanizates, PV modules comprising such TPV-based back sheets, and methods for forming the TPV back sheets and PV modules. TPV-based back sheets provide particular advantages over incumbent back sheets, including increased flexibility, greater electrical insulation properties, and more desirable barrier properties. The TPV-based back sheets of some embodiments provide PV modules improved endurance, particularly under the changing and often harsh environmental conditions in which PV modules are often deployed. The TPV-based back sheets of some embodiments also enable efficient construction of unusual PV module geometries, such as non-planar (e.g., curved and/or hinged) geometries.

8 Claims, 11 Drawing Sheets

(51) Int. Cl.
*C09D 123/16* (2006.01)
*H01L 31/049* (2014.01)
*C09D 123/10* (2006.01)
*B32B 27/08* (2006.01)

(52) U.S. Cl.
CPC .......... *C09D 123/16* (2013.01); *H01L 31/049* (2014.12); *B32B 27/08* (2013.01); *B32B 2457/12* (2013.01)

(56) References Cited

U.S. PATENT DOCUMENTS

| | | | |
|---|---|---|---|
| 3,287,440 | A | 11/1966 | Giller et al. |
| 4,311,628 | A | 1/1982 | Abdou-Sabet et al. |
| 4,387,176 | A | 6/1983 | Frye |
| 4,540,753 | A | 9/1985 | Cozewith et al. |
| 4,543,399 | A | 9/1985 | Jenkins, III et al. |
| 4,588,790 | A | 5/1986 | Jenkins, III et al. |
| 4,594,390 | A | 6/1986 | Abdou-Sabet et al. |
| 4,613,484 | A | 9/1986 | Ayres et al. |
| 5,001,205 | A | 3/1991 | Hoel |
| 5,028,670 | A | 7/1991 | Chinh et al. |
| 5,100,947 | A | 3/1992 | Puydak et al. |
| 5,157,081 | A | 10/1992 | Puydak et al. |
| 5,198,401 | A | 3/1993 | Turner et al. |
| 5,290,866 | A | 3/1994 | Dobreski et al. |
| 5,317,036 | A | 5/1994 | Brady, III et al. |
| 5,352,749 | A | 10/1994 | DeChellis et al. |
| 5,391,629 | A | 2/1995 | Turner et al. |
| 5,397,832 | A | 3/1995 | Ellul |
| 5,405,922 | A | 4/1995 | DeChellis et al. |
| 5,436,304 | A | 7/1995 | Griffin et al. |
| 5,453,471 | A | 9/1995 | Bernier et al. |
| 5,462,999 | A | 10/1995 | Griffin et al. |
| 5,616,661 | A | 4/1997 | Elsinger et al. |
| 5,656,693 | A | 8/1997 | Ellul et al. |
| 5,627,242 | A | 9/1997 | Jen |
| 5,665,818 | A | 9/1997 | Tilston et al. |
| 5,668,228 | A | 9/1997 | Chinh et al. |
| 5,677,375 | A | 10/1997 | Rifi et al. |
| 5,693,727 | A | 12/1997 | Goode et al. |
| 5,712,352 | A | 1/1998 | Brant et al. |
| 5,804,678 | A | 9/1998 | Morita et al. |
| 5,936,041 | A | 8/1999 | Medsker et al. |
| 5,952,425 | A | 9/1999 | Medsker et al. |
| 6,042,260 | A | 3/2000 | Heidemeyer et al. |
| 6,147,160 | A | 11/2000 | Wang et al. |
| 6,437,030 | B1 | 8/2002 | Coran et al. |
| 6,451,915 | B1 | 9/2002 | Ellul et al. |
| 6,867,260 | B2 | 3/2005 | Datta et al. |
| 6,881,800 | B2 | 4/2005 | Friedersdorf |
| 6,992,158 | B2 | 1/2006 | Datta et al. |
| 7,232,871 | B2 | 6/2007 | Datta et al. |
| 7,284,897 | B2 | 10/2007 | Blach |
| 7,902,301 | B2 | 3/2011 | Kempe et al. |
| 8,183,329 | B2 | 5/2012 | Kempe et al. |
| 8,895,832 | B2 | 11/2014 | Fukada |
| 9,006,332 | B2 | 4/2015 | Kerstetter, III et al. |
| 2002/0169240 | A1 | 11/2002 | Bar-Yakov et al. |
| 2005/0107530 | A1 | 5/2005 | Datta et al. |
| 2006/0269771 | A1 | 11/2006 | Cogen et al. |
| 2007/0015877 | A1 | 1/2007 | Burkhardt et al. |
| 2008/0245405 | A1* | 10/2008 | Garvison ............... H01L 31/048 136/251 |
| 2009/0247656 | A1 | 10/2009 | Jacob et al. |
| 2010/0113694 | A1 | 5/2010 | Nadella et al. |
| 2010/0120953 | A1 | 5/2010 | Aarts et al. |
| 2010/0298473 | A1 | 11/2010 | Yokota et al. |
| 2011/0041891 | A1 | 2/2011 | Rurnmens et al. |
| 2012/0024348 | A1* | 2/2012 | Prejean .................. B32B 3/08 136/251 |
| 2012/0240981 | A1* | 9/2012 | Cheng .................... B32B 15/06 136/251 |
| 2014/0076382 | A1 | 3/2014 | Dafniotis |
| 2014/0076395 | A1 | 3/2014 | Dafniotis |
| 2014/0096825 | A1* | 4/2014 | Bonekamp ............ B32B 27/32 136/259 |
| 2015/0311370 | A1* | 10/2015 | Chou ................... H01L 31/049 136/251 |

FOREIGN PATENT DOCUMENTS

| | | |
|---|---|---|
| JP | H07-062168 A | 3/1995 |
| JP | H07-285143 A | 10/1995 |
| JP | H09-012799 A | 1/1997 |
| JP | H09-012800 A | 1/1997 |
| JP | 2002-348430 A | 12/2002 |
| WO | 96/08520 A | 3/1996 |
| WO | 96/33227 A | 10/1996 |
| WO | 97/22639 A | 6/1997 |
| WO | 00/01745 A | 1/2000 |
| WO | 00/01766 A | 1/2000 |
| WO | 02/036651 A | 5/2002 |
| WO | 03/046071 A | 6/2003 |
| WO | 2004/074361 A | 9/2004 |
| WO | 2005/092964 A | 10/2005 |
| WO | 2008/076264 A | 6/2008 |
| WO | 2008/124040 A | 10/2008 |
| WO | 2009/032622 A | 3/2009 |
| WO | 2009/095274 A | 8/2009 |
| WO | 2009/153786 A | 12/2009 |
| WO | 2010/055507 A | 5/2010 |
| WO | 2011/046545 A | 4/2011 |
| WO | 2011/153681 A | 12/2011 |
| WO | 2012/030577 A | 3/2012 |
| WO | 2013/135349 A | 9/2013 |
| WO | 2017/172056 A | 10/2017 |

OTHER PUBLICATIONS

Ellul et al., "Crosslink Densities and Phase Morphologies in Dynamically Vulcanized TPEs ," Rubber Chemistry and Technology, vol. 68, pp. 573-584 (1995).

Rummens, "Long Term Accelerated Weathering Tests on 'Coupons' to Develop New Classes of Backsheets," Session 5CV.2.8, 31st European Photovoltaic Solar Energy Conference and Exhibition, pp. 2478-2481 (Sep. 2015).

* cited by examiner

THERMOPLASTIC VULCANIZATE COMPOSITIONS FOR PHOTOVOLTAIC CELL APPLICATIONS

CROSS-REFERENCE OF RELATED APPLICATIONS

This application is a National Phase Application claiming priority to PCT Application Serial No. PCT/US2017/017156 filed Feb. 9, 2017, which claims the benefit of Ser. No. 62/315,329 entitled "Thermoplastic Vulcanizate Compositions for Photovoltaic Cell Applications" filed on Mar. 30, 2016, and European Application No. 16170982.9 filed May 24, 2016. This application is also related to U.S. Provisional Application Ser. No. 62/315,337, entitled "Photovoltaic Module Back Sheets Comprising Thermoplastic Vulcanizate Compositions" filed on Mar. 30, 2016.

FIELD OF THE INVENTION

This disclosure relates to photovoltaic devices, such as photovoltaic cell modules. In particular, the disclosure relates to thermoplastic vulcanizate compositions, articles, and methods for manufacture thereof, that are useful in such photovoltaic devices, e.g., as back sheet and/or encapsulant material in photovoltaic cell modules.

BACKGROUND OF THE INVENTION

Photovoltaic (PV) modules typically include PV cells for converting solar energy to electrical energy. The PV cells must be suitable for long-term outdoor use; however, they can be quite susceptible to wear and tear when employed in such outdoor uses. Thus, many typical PV cells are disposed within glass and other encapsulant protective layers. Conventionally, a transparent polymeric material such as polyethylene vinyl acetate (EVA) forms the encapsulant. However, this alone is not enough. It is therefore typical to apply a sheet to the back side of the PV cell (more specifically, to the encapsulant on the back side of the PV cell), called a "back sheet," to help protect the encapsulated PV cell (e.g., to provide mechanical resistance, corrosion resistance, electrical insulation, and to act as a barrier to various media, including water and other liquids, among other desirable functions). Such back sheets are frequently laminated onto the encapsulant covering the back of the PV cell (i.e., the side opposite the PV cell side aimed to capture solar energy) during manufacturing of the cell.

Conventional back sheets are typically formed of multiple layers, each serving to provide various forms of protection (e.g., against moisture ingress, mechanical deformation, electrical charge loss, etc.). Examples include three-layer constructions in which a layer of polyethylene terephthalate (PET) is surrounded by two other layers (each of which may independently be made from various other polymeric compounds, such as polyvinylidene difluoride (PVDF) or other fluoropolymers, ethylene vinyl acetate (EVA), polyethylene, or a combination thereof).

Each of these conventional back sheet constructions suffers from various disadvantages. For instance, multi-layer sheets are more complex, and therefore generally more costly, to construct. Furthermore, the risk of delamination over the lifetime of the PV module increases with a greater number of layers laminated together to form the back sheet. These back sheets may also have higher rigidity than desired, leaving them susceptible to rupture and/or reducing the flexibility of the PV module.

Ethylene-propylene-diene monomer-based (EPDM) rubbers have been proposed as an alternative back-side encapsulant which could also serve the protective functions of the back sheet (e.g., such that no additional back sheet material is needed). See, for instance, Kempe & Thapa, Low Cost, Single Layer Replacement for the Back-Sheet and Encapsulant Layers, Conf. Paper NREL/CP-520-42795, Presented August 10-14 at the 2008 SPIE PV Reliability Symposium; U.S. Pat. Nos. 7,902,301; 8,183,329. However, such back sheets have not been adopted by the market, and they furthermore present adhesion and processing problems during fabrication of PV modules.

Other references of interest include U.S. Pat. Nos. 2,972,600; 3,248,179; 3,287,440; 4,311,628; 4,387,176; 4,540,753; 4,543,399; 4,588,790; 4,594,390; 4,613,484; 5,001,205; 5,028,670; 5,100,947; 5,157,081; 5,198,401; 5,290,866; 5,317,036; 5,352,749; 5,391,629; 5,397,832; 5,405,922; 5,436,304; 5,453,471; 5,462,999; 5,616,661; 5,627,242; 5,656,693; 5,665,818; 5,668,228; 5,677,375; 5,693,727; 5,712,352; 5,936,028; 5,952,425; 6,042,260; 6,147,160; 6,437,030; 6,451,915; 6,867,260; 6,881,800; 6,992,158; 7,232,871; 8,895,835 and 9,006,332; U.S. Patent Publication Nos. 2002/0169240; 2005/0107530; 2006/0269771; 2007/0015877; 2009/0247656; 2010/0113694; 2010/0298473; 2010/0120953; 2011/0041891; 2012/0240981; 2014/0076382; and 2014/0076395; EP Patent Publication No. 2 405 489 A1; EP 0794200, EP 0802202, EP 0634421; Chinese Publication No. 101469095 A; Japanese Patent Publication Nos. H07-062168, H07-285143, H09-012799, H09-012800, and 2002-348430; as well as WIPO Publication Nos. WO 96/08520; WO 96/33227; WO 97/22639; WO 00/01745; WO 00/01766; WO 02/036651; WO 03/046071; WO 2004/074361; WO 2004/009327; WO 2005/092964; WO 2008/076264; WO 2008/124040; WO 2009/032622; WO 2009/153786; WO 2011/046545; WO 2012/030577. Other non-patent references of interest include: Ellul et al., "Crosslink Densities and Phase Morphologies in Dynamically Vulcanized TPEs," Rubber Chemistry and Technology, Vol. 68, pp. 573-584 (1995); and Rummens, "Long Term Accelerated Weathering Tests on 'Coupons' to Develop New Classes of Backsheets," Session 5CV.2.8, 31$^{st}$ European Photovoltaic Solar Energy Conference and Exhibition, pp. 2478-2481 (September 2015).

SUMMARY OF THE INVENTION

The present inventors have found that certain thermoplastic vulcanizate (TPV) compositions and materials can be useful for forming back sheets for photovoltaic cells. Thus, in some aspects, the present invention includes TPV-based back sheets (i.e., those comprising, consisting of, or consisting essentially of one or more TPVs). Suitable TPVs include an at least partially crosslinked rubber phase (typically small crosslinked rubber particles) dispersed within a continuous thermoplastic matrix. A preferred rubber in particular embodiments comprises EPDM. The continuous thermoplastic matrix in some embodiments comprises a thermoplastic polyolefin, such as polypropylene. TPVs having hardness of at least 55 Shore A, preferably at least 70 Shore A, are particularly suitable for formation into back sheets according to various embodiments herein. Preferably, such TPVs also or instead have modulus at 100% elongation ("M100") within the range from 1 to 15 MPa, more preferably 1 to 6 MPa, so as to exhibit desired flexibility in PV modules.

TPV-based back sheets according to some embodiments preferably have an average thickness ranging from 0.1 to 2 mm, such as 0.1 to 1.5 mm, or 0.20 to 0.40 mm, in various embodiments. The remaining dimensions of the sheets (either or both of height and width) can each vary to fit the needs of the application, ranging, e.g., from 5 cm to 5 m, 10 m, or even more.

In yet further aspects, the present invention includes photovoltaic (PV) modules comprising one or more PV cells and one or more back sheets according to the foregoing description. The PV cells of some embodiments are at least partially encapsulated in one or more encapsulants. PV modules of some embodiments include a front encapsulant layer and a back encapsulant layer, which may be the same as or different from each other. The front encapsulant layer is at least partially transparent to incident electromagnetic radiation; the back encapsulant layer may be, but is not necessarily, transparent. Preferably, the back sheets of some embodiments are in contact with the back encapsulant layer. More preferably, the back sheets of certain of these embodiments are also adhered at least in part to the back encapsulant layer. Likewise, various aspects also provide processes for forming such PV modules, including adhering a TPV-based back sheet to a PV cell and/or to an encapsulant layer as part of the process to form a PV module.

Yet further aspects include PV modules having non-planar and/or hinged geometries. For instance, a hinged PV module according to some embodiments comprises a single continuous TPV-based back sheet having disposed thereon (and coupled thereto) a plurality of PV module assemblies. Each PV module assembly comprises PV cells at least partially encapsulated in an encapsulant, and preferably further comprises a front sheet and side frames. The front sheet and side frames may make the PV module assembly substantially rigid; also or instead, the encapsulant could be selected so as to make the PV module assembly substantially rigid, possibly without the need of front sheet and/or side frames. The PV module assemblies are separated by hinge spaces located at one or more hinged locations along the back sheet. The hinged locations preferably are variable hinged locations, enabling the back sheet to be folded at each hinged location, e.g., in an accordion style, enabling the PV module to be folded for transport purposes, or deployed in non-planar geometries requiring one or more angles between front (e.g., light-facing) surfaces.

DETAILED DESCRIPTION OF ILLUSTRATIVE EMBODIMENTS

Definitions

Figure 1:
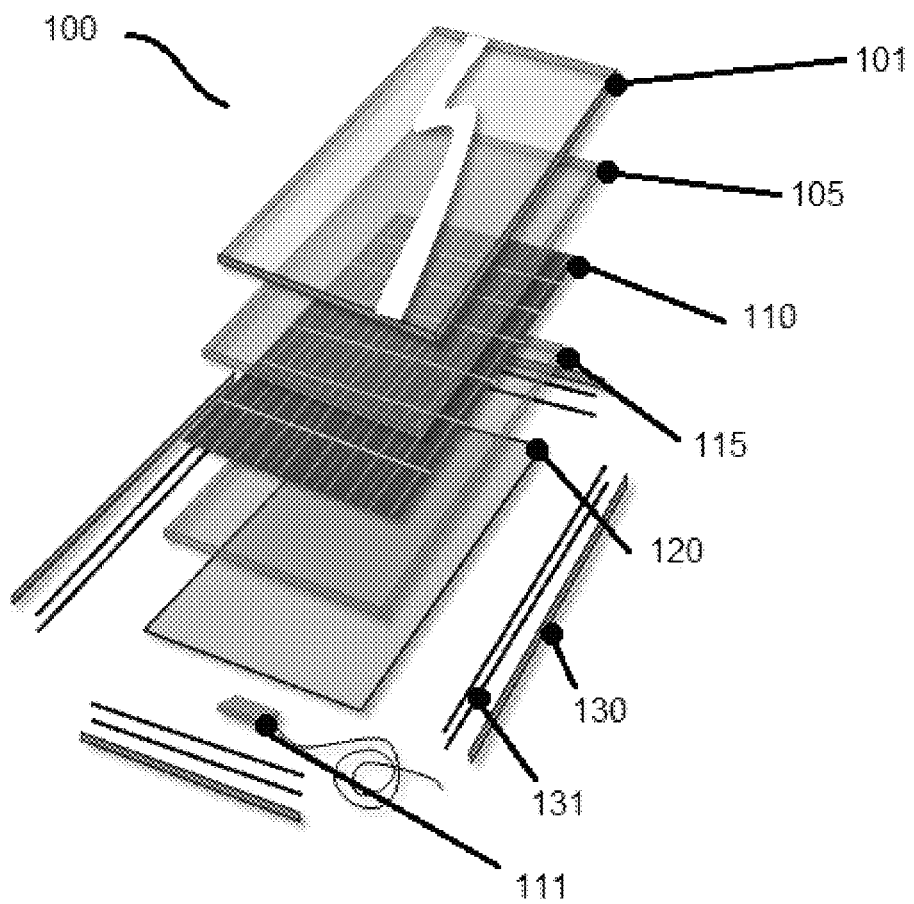
FIG. 1 is a break-away style schematic of a PV module in accordance with some embodiments of the present disclosure.

Definitions applicable to the presently described invention are as described below, as are methods of measurement of some properties relevant to certain embodiments of the invention.

A "photovoltaic cell" or "PV cell" is an electronic device capable of converting electromagnetic radiation into electrical energy. Typical PV cells include photoactive material(s) capable of absorbing electromagnetic radiation, as well as charge transport material(s) (which may be the same or different material as the photoactive material) useful in converting the electromagnetic radiation into electrical energy.

A "photovoltaic module" or "PV module" is any device comprising at least one PV cell. Typical PV modules include some form of housing and/or encapsulant to protect the PV cell.

When used in connection with a PV module and/or PV cell, the "front" of a cell or module is taken as the surface of the module and/or cell that is most directly incident to incoming electromagnetic radiation when the module and/or cell is employed in its intended use (e.g., to convert incident electromagnetic radiation into electrical energy). The "back" of the PV module and/or PV cell should be taken as the opposite.

As used herein, any electromagnetic radiation that a PV cell can convert to electrical energy may be referred to as "light." This usage does not imply that such radiation is necessarily limited to the visible spectrum of electromagnetic radiation.

As used herein, wt % means percent by weight, or weight percentage, and wppm means parts per million, on a weight basis. Unless otherwise indicated, percentages and ppm values should be assumed to be wt % and wppm.

Reference is made herein to polymers comprising various monomeric units, e.g., ethylene-derived units, ethylene units, or simply ethylene. Where a polymer is referenced as comprising "ethylene units" or "ethylene," it should be understood to mean that the polymer contains "ethylene-derived units"—that is, ethylene in its polymerized form (—CH$_2$CH$_2$—). The same should be assumed for references to any other monomeric units making up a polymer (e.g., propylene or propylene-derived units).

The term "elastomer," as used herein, refers to any polymer or combination of polymers consistent with the ASTM D1566 definition of "a material that is capable of recovering from large deformations, and can be, or already is, modified to a state in which it is essentially insoluble (but can swell) in boiling solvent." As used herein, the term "elastomer" may be used interchangeably with the term "rubber."

The term "thermoplastic vulcanizate" or "TPV" is broadly defined as any material that includes an at least partially vulcanized rubber component dispersed within a continuous thermoplastic matrix. A suitable TPV material can further include other ingredients, such as one or more oils and/or other additives.

The term "vulcanizate" means a composition that includes some component (e.g., rubber) that has been vulcanized. The term "vulcanized" is defined herein in its broadest sense, and refers in general to the state of a composition after all or a portion of the composition (e.g., crosslinkable rubber) has been subjected to some degree or amount of vulcanization. Accordingly, the term encompasses both partial and total vulcanization, and furthermore encompasses any form of curing (crosslinking)—thermal, chemical, or otherwise—that can be utilized in dynamic vulcanization.

A preferred type of vulcanization is "dynamic vulcanization." The term "dynamic vulcanization" means vulcanization or curing of a curable rubber blended with a thermoplastic resin under conditions of shear at temperatures sufficient to plasticize the mixture. In preferred embodiments, the rubber is simultaneously crosslinked and dispersed ad micro-sized particles within the thermoplastic resin. Depending on the degree of cure, the rubber to thermoplastic resin ratio, compatibility of the rubber and thermoplastic resin, the kneader type and the intensity of mixing (shear rate), other morphologies, such as co-continuous rubber phases in the plastic matrix, are possible.

As used herein, a "partially vulcanized" rubber is one wherein more than 5 weight percent (wt %) of the crosslinkable rubber is extractable in boiling xylene, subsequent to vulcanization (preferably dynamic vulcanization), e.g., crosslinking of the rubber phase of the TPV. For example, in a TPV comprising a partially vulcanized rubber at least 5 wt % and less than 10, 20, 30, or 50 wt % (in varying embodiments) of the crosslinkable rubber is extractable from the specimen of the TPV in boiling xylene (said wt % based upon the total weight of rubber present in the TPV specimen). The percent of soluble rubber in the cured composition is determined by refluxing a specimen in boiling xylene, weighing the dried residue and making suitable corrections for soluble and insoluble components based upon knowledge of the composition. Thus, corrected initial and final weights are obtained by subtracting from the initial weight of the soluble components, other than the rubber to be vulcanized, such as extender oils, plasticizers, and components of the compositions soluble in organic solvent, as well as thermoplastic components that are not intended to cure. Any insoluble pigments, fillers, etc., are subtracted from both the initial and final weights. Any materials in the uncured rubber that are soluble in refluxing xylene are subtracted from the rubber when calculating the percent of soluble rubber in a cured composition. A further description of the technique for determining the percentage of extractable rubber is set forth in Column 4, lines 19-50 of U.S. Pat. No. 4,311,628, which description is hereby incorporated by reference.

As used herein, a "fully vulcanized" (or fully cured or fully crosslinked) rubber is one wherein less than 5 wt % of the crosslinkable rubber is extractable in boiling xylene, subsequent to vulcanization (preferably dynamic vulcanization), e.g., crosslinking of the rubber phase of the TPV. For example, in a TPV comprising a fully vulcanized rubber, less than 4, 3, 2, or even 1 wt % of the crosslinkable rubber is extractable from the specimen of the TPV in boiling xylene. In some embodiments, in a TPV comprising a fully vulcanized rubber, from 0.5 to 2.0 wt %, such as from 0.1 to 2.0 wt %, of the crosslinkable rubber is extractable from the specimen of the TPV in boiling xylene.

Thus, TPVs according to various embodiments may have less than 20, 15, 10, 5, 4, 3, 2, or even 1 wt % of crosslinkable rubber extractable in boiling xylene from a specimen of the TPV, and at least 0.0, 0.1, or 0.5 wt % rubber extractable in boiling xylene.

As used herein, "extender oil" and "processing oil" may have similar compositions, or be selected from the same or similar compounds. The terms are used to distinguish the timing in the manufacturing cycle of elastomeric compositions (including TPVs) at which the oil is introduced. "Extender oil" is oil that is added to or otherwise incorporated with an elastomer following its polymerization, e.g., incorporated (along with any other desired additives) as part of the elastomer pellets, bales, or the like that are shipped or otherwise provided to downstream manufacturers, who in turn process the elastomer into intermediate products (including TPVs) and/or finished goods. "Processing oil" or "process oil" is formulated with the elastomer during such downstream manufacturing (e.g., during extrusion, mixing, or other processing of the elastomer, including formation into a TPV). Where oil content of a TPV formulation is recited herein, it is intended to refer only to the amount of process oil added to the TPV formulation as part of the process for forming a TPV from one or more elastomers and one or more thermoplastic resins; any extender oil that might be present in the elastomer(s) used in forming the TPV is excluded by such recitation.

As used herein, a "Group I oil", a "Group II oil", a "Group III oil", a "Group IV oil" (also referred to as a polyalphaolefin or "PAO") and a "Group V oil" refer to the respective base stock oil group as understood in accordance with the American Petroleum Institute (API)'s categorization of base stock oils (set forth in Annex E of API 1509, 17th Edition, Addendum 1 (March 2015), incorporated herein by reference). For instance, a Group I oil is a petroleum-derived base oil or basestock oil having less than 90 wt % saturates (as determined in accordance with ASTM D2007), greater than 300 wppm sulfur (as determined in accordance with ASTM D1552, ASTM D2622, ASTM D3120, ASTM D4294, or ASTM D4297, with ASTM D4294 prevailing in case of conflicting results among those methods), and having a viscosity index ranging from 80 to 120 (as determined by ASTM D2270). Likewise, a Group II oil is a petroleum-derived base oil or basestock oil having greater than or equal to 90 wt % saturates, less than or equal to 300 wppm sulfur content, and a viscosity index ranging from 80 to 120 (each property determined by the same methods identified for Group I oils). Group III, IV, and V oils are similarly in accordance with their description in Annex E of API 1509.

Photovoltaic Modules

The present disclosure includes in various embodiments a photovoltaic (PV) module, sometimes also referred to as a solar panel, having a back sheet comprising a thermoplastic vulcanizate (TPV). Further details of the back sheet and TPVs suitable for use as the back sheet, including constituents and formation, are discussed in greater detail below.

PV modules according to some embodiments may include, as shown in the break-away schematic of FIG. 1, a superstrate or front sheet 101, which is at least partially transparent to incident electromagnetic radiation (e.g., light). The more transparent the front sheet, the better. As illustrated in FIG. 1, the front sheet 101 is glass, although other materials (e.g., transparent polymeric materials such as polyethylene) may instead form the front sheet. Further, front sheets according to some embodiments may include protective coatings or the like, e.g., to provide resistance to scratching or fouling (not shown in FIG. 1). PV modules according to yet other embodiments may optionally omit the front sheet (for instance where a front encapsulant layer 105, discussed in more detail below, provides adequate protection against the elements in the environment in which the PV module is to be employed).

Beneath the front sheet 101, if present, is an array of PV cells 110 at least partially encapsulated in an encapsulant, shown in FIG. 1 as comprising a front encapsulant layer 105 and a back encapsulant layer 115. The front encapsulant layer 105 comprises a front encapsulant material, and preferably, like the front sheet 101, is at least partially transparent to electromagnetic radiation. The back encapsulant layer 115 comprises a back encapsulant material. Unlike the front encapsulant layer 105, the back encapsulant layer 115 may be, but need not be, transparent. Thus, the front and back encapsulant may in some embodiments be of the same or different composition, and the encapsulant of some embodiments may be described generally as including an at least partially transparent front encapsulant material coating a front surface of the PV cell or cells, and a back encapsulant material coating a back surface of the PV cell or cells. Either or both of the front and back encapsulant may cover, at least in part, the sides of the PV cell or cells. Suitable encapsulant materials (either or both of front and back encapsulant material) are described in greater detail below.

Finally, a substrate or back sheet 120 is in contact with, and preferably also adhered to at least a portion of, the back encapsulant layer 115. The front sheet 101 and back sheet 120 sandwich the encapsulated PV cell(s) in the module 100. Back sheets according to embodiments disclosed herein comprise, consist of, or consist essentially of, a TPV. Suitable TPVs, and their methods of formation into back sheets, are described in greater detail below, following further discussion of the encapsulants. When used in this context, a back sheet "consists essentially of" a TPV when the back sheet contains less than 5 wt % of material other than the TPV (e.g., including processing oil used in post-processing of the TPV, including formation of the TPV into a back sheet, and also including impurities or other materials such that the measurable properties of the back sheet with such oil, impurities, and/or materials are changed by no more than +/−5% as compared to the same properties of a back sheet comprising only the TPV, and which is otherwise identical).

PV modules according to some embodiments may also include a side frame 130, which may be made of any suitable material (e.g., aluminum, other metals, thermoplastics, and the like). A side frame may protect the internals of the module (e.g., encapsulants 105 and 115, and PV cells 110). The module may also include a sealant system 131 between the frame and the layers of the module, to help prevent ingress of contaminants and/or to adhere the side frame to one or more layers of the module. Any known suitable sealant system may be used, including, e.g., butyl-based compounds.

The PV cells 110 of FIG. 1 are electrically coupled, directly or indirectly, to a junction box 111. Other embodiments may include one or more electrical conduits coupling the PV cell(s) 110 to an external circuit (without necessarily including the junction box 111). Ordinarily skilled artisans will recognize numerous means of electrically coupling the PV cell(s) 110 to external electrical circuits, storage means (e.g., capacitors), and the like, by use of any suitable charge-carrying conduit or other device, all of which are within the scope of PV modules provided in this disclosure. Further, PV cells according to various embodiments may include coatings (e.g., aluminum paste or other coatings known to those of skill in the art). References herein to "PV cells" include both coated and uncoated cells (e.g., description of PV cells that are at least partially encapsulated in an encapsulant may include both uncoated cells that are so encapsulated, and coated cells that are so encapsulated).

The encapsulants and back sheets of PV modules in accordance with various embodiments will now be discussed in greater detail.

Encapsulants

As noted, the front encapsulant material should be at least partially transparent. Suitable front encapsulants include transparent polymeric materials that provide the PV cell with at least some degree of electrical isolation and protection from environmental contaminants (e.g., moisture, other liquids and/or gases, and particulate contaminants). Preferably, the encapsulant adheres to the front sheet (e.g., glass), when present in the PV module. In general, any PV cell encapsulant known in the art or later found to be a suitable encapsulant for PV cells should be a suitable front encapsulant for PV modules of various embodiments herein. Examples of known encapsulants include those in accordance with the description found in U.S. Pat. No. 6,093,757, or in publications relating to PV cell encapsulants. See, e.g., Kempe et al., "Types of Encapsulant Materials and Physical Differences Between Them," Nat'l Renewable Energy Laboratory 2010, available at http://www1.eere.energy.gov/solar/pdfs/pvrw2010_kempe.pdf (last accessed Mar. 10, 2016). For instance, the front encapsulant material may include polymeric material comprising one or more of ionomers, thermoplastic poly urethanes (TPUs), polyvinyl butyral (PVB), poly dimethyl silicone or poly(dimethylsiloxane) (PDMS), ethylene vinyl acetate (EVA), and any other polymeric material having good optical transmittance and providing the PV cell an at least partial barrier to moisture and other gas, liquid, and solid contaminants. In some particular embodiments, the polymeric material is at least partially cross-linked in the assembled PV module. Thus, the formulated encapsulant material of such embodiments, prior to heating or other activation during assembly of a PV module (discussed in greater detail below), includes cross-linkable polymeric material.

Encapsulant material may be formulated with one or more encapsulant additives, such as curatives (e.g., peroxides phenolic resins, and the like), ultraviolet light stabilizers (e.g., hindered amines), ultraviolet light absorbers (e.g., benzoltriazole), adhesion promoters (e.g., trialkoxy silane), and/or radical scavengers (e.g., phenolic phosphonate, particularly useful where peroxide curatives or other free-radical-forming curatives are present). Some of these additives (e.g., curatives) may be consumed at least in part during formation of the PV module. For instance, when the encapsulant formulation is heated during processing of the PV module, discussed in greater detail below, at least some curative may be consumed in cross-linking any cross-linkable polymeric material present in the encapsulant formulation.

Suitable back encapsulant materials include any of the materials suitable as a front encapsulant. However, back encapsulant may also or instead include polymeric material with little or no optical transmittance (i.e., that has little or no transparency), such as one or more of EPDM, polyethylene terephthalate (PET), a polyamide, polyvinyl fluoride, polyvinylidene fluoride, ethylene-propylene-diene (EPDM) rubber, and the like.

Preferred encapsulants (front and back) not only help protect the PV cell(s) from mechanical damage during the lifetime of the PV module; they also can help protect the cell(s) from ingress of harmful liquids, gases, and solids from the environment in which the PV cell is deployed. Encapsulants also provide temperature and electrical insulation, so as to keep the PV cell(s) in a desired temperature range during operation, and furthermore to help maximize the transport of electrical charge along a desired conduit from the PV cell(s).

Preferably, the encapsulant (comprising front and back encapsulant layers) adheres, at least partially, to all three of the front sheet (if present), PV cell(s), and the back sheet, so as to fix the PV cell(s) substantially in place during the lifetime of the PV module. In particular, the front encapsulant adheres at least partially to the front sheet and to the front surface of each PV cell, while the back encapsulant adheres at least partially to the back sheet and to the back surface of each PV cell. Either or both of the front and back encapsulant may in some embodiments flow along the sides of the PV cell(s) or PV cell matrix during formation of the PV module, so as to encapsulate the PV cell(s) or PV cell matrix on the sides as well as the front and back surfaces, so as to provide further stability to the cells. Advantageously, in certain embodiments, no adhesive is required to adhere the encapsulant (e.g., the back encapsulant, in embodiments where back and front encapsulant differ) directly to the back sheet. This is particularly so where the PV module is made using a lamination and heating process in accordance with some processes for forming PV modules described in more detail below. Such direct adhesion avoids the extra cost and complexity of separate adhesive layers that are often required to adhere encapsulants to conventional back sheets.

TPV-Based Back Sheets

As noted, back sheets of various embodiments comprise, consist of, or consist essentially of, a TPV.

Preferred back sheets range in thickness from about 0.10 mm to 15.00 mm, most preferably within the range of 0.20 to 1.5 mm, such as 0.25 to 0.40 mm, or 0.25 to 0.35 mm, where ranges from any of the just-recited minimum end points to any of the larger maximum end points are also contemplated (e.g., 0.20 to 0.35 mm, etc.). Thickness may be measured by any accepted standard (e.g., ISO 23529, ISO 3302-1, etc.), but in the event that thickness measurements obtained by different methods vary by more than 0.01 mm, thickness determined in accordance with ISO 23529:2010, Section 7.1 (Method A for measuring dimensions of less than 30 mm) shall govern, provided that where thickness determined by this method varies by more than 0.01 mm from location to location along the sheet surface, thickness should be taken as the average thickness (arithmetic mean) of measurements at five different locations along the surface of the back sheet. Further, where the sheet has one or more hinged locations (discussed in more detail below), average thickness should be measured at points on the back sheet not located at one of the hinged locations.

Other dimensions of suitable back sheets (e.g., length, width) may vary widely. For instance, either of length and width may be as short as 5 cm and as long as 5 m, or even longer, in various embodiments. Preferably, length and/or width are within the range of from 20 cm to 5 m, such as within the range of from 30 cm to 2 m, or 30 cm to 1.6 m. Suitable back sheet dimensions may be square (e.g., 1 m×1 m), rectangular (e.g., 1 m×1.6 m), circular (having diameter according to the above descriptions of length and/or width), or any other shape (with maximum length and/or width along such shape in accordance with the foregoing description).

TPV-based back sheets (i.e., those comprising, consisting of, or consisting essentially of one or more TPVs) offer substantial benefits as compared to conventional back sheet materials. Back sheets according to some embodiments serve various functions for a PV module, including electrical insulation and mechanical protection (e.g., from impact, puncture, ingress of debris). Back sheets also may advantageously act as barriers against liquid and/or gas contaminants. Although in some instances it is thought that a complete barrier to such contaminants might be desired, it may be more preferable that the back sheet ensure that all undesired materials that are created in the encapsulant during the production of the module or during its normal use can escape from the PV module. For instance, where the encapsulant formulation includes crosslinkable polymeric materials (and, more particularly, also includes one or more curatives), such materials will likely at least partially cross-link during fabrication of the PV module. Furthermore, to the extent some non-cross-linked polymer and curative remain in the encapsulant after fabrication of the PV module, such may further cross-link when the module is deployed in the field. For instance, the greater the heat, moisture, and/or radiation to which cross-linkable encapsulant is exposed, the more likely further cross-linking reactions are to take place. These cross-linking reactions may generate byproducts that may adversely affect the encapsulated PV cells' operation—particularly when such byproducts are entrapped with the PV cells within the encapsulant. For instance, peroxide-based crosslinking reactions are thought to generate byproducts that can corrode the metal side frames of some PV modules, exposing the PV module internals to environmental contaminants. It is therefore desirable for the back sheet to allow migration of such byproducts out of the module. At the same time, however, the back sheet preferably prevents undesired contaminants (e.g., moisture) from entering the PV module from the environment in which the module is deployed, or alternatively, even if the back sheet permits such contaminants to enter the PV module, the back sheet also readily expels them from the module. For instance, in some embodiments, a TPV-based back sheet may allow some degree of moisture ingress at elevated temperatures (e.g., during particularly high temperature exposure during operation of the PV module), but furthermore expels moisture once the temperature cools. Thus, back sheets may advantageously exhibit selective barrier properties rather than acting as complete barriers, and/or back sheets may advantageously permit migration of contaminants out from the PV cell during certain conditions (e.g., escape of water or water vapor in elevated temperatures), but not others (so as to prevent undesired ingress).

Back sheets exhibiting such desirable barrier properties may advantageously prolong the active life of the PV module. To minimize the complexity involved in accounting for all possible contaminants and the various competing desired barrier properties in a back sheet, Damp Heat (D-H) testing may aid in determining whether a back sheet provides such advantages. Damp Heat testing, as set forth in more detail in the Examples section below, involves exposing a sample PV module to harsh environmental conditions and monitoring the various properties of the module (e.g., maximum permissible voltage, module power output at maximum power point, module series resistance, and module short-circuit current) or back sheet (e.g., adhesive strength to encapsulant) in order to assess the time over which the module will continue to perform acceptably in converting solar energy to electrical energy. D-H testing herein is carried out according to the protocols set forth for Damp Heat testing in IEC 61215, except that times other than the 1000 h exposure called for in IEC 61215 are used where indicated (e.g., 2000 h or even 3000 h).

Thus, the advantageous barrier properties of TPV-based back sheets according to various embodiments is shown through successful Damp Heat testing, set forth in Examples below, and further summarized in the below discussion of advantageous properties of PV modules in accordance with some embodiments of the present invention.

As another example, TPV-based back sheets according to some embodiments have greater flexibility as compared to conventional back sheets, as indicated by, e.g., the modulus at 100% elongation ("M100") of the TPV-based back sheet (and/or of the TPV from which the back sheet is formed). This high flexibility (low stiffness) means that the force required to expand or contract the sheet when the PV module expands or contracts as a result of differences in module temperature (e.g., due to day/night and seasonal cycles) will be low, and therefore will not add much force to the total of stresses that act on the module. This reduced expansion/contraction force may improve the lifetime of PV modules according to various embodiments, as compared to conventional PV modules. Preferred M100 values of TPVs used to form TPV-based back sheets according to some embodiments are discussed in greater detail below in connection with the description of suitable TPVs for forming TPV-based back sheets.

Figure 2A:
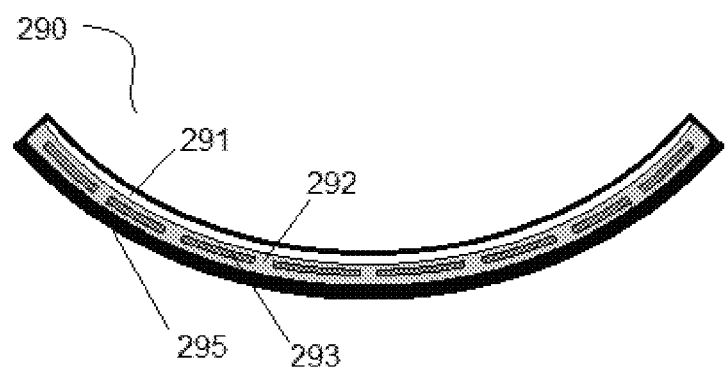
FIG. 2a is a side-view illustration of a non-planar PV module having concave curvature, in accordance with some embodiments.
Figure 2B:
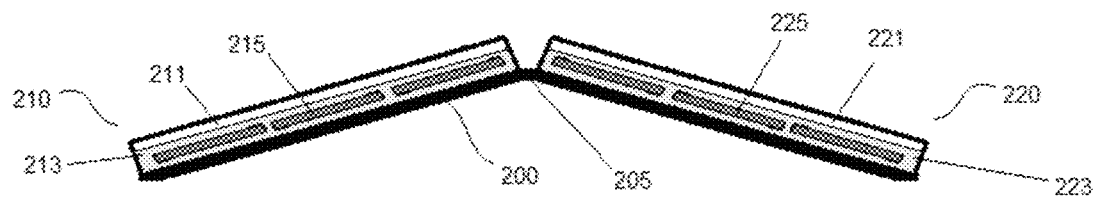
FIG. 2b is a side-view illustration of a hinged PV module in accordance with some embodiments of the present disclosure.

Another advantage provided by the TPV-based back sheet's flexibility is the possibility for hinged or other PV modules having non-planar geometry. As used herein, a PV module has "non-planar geometry" when any one side-on cross section of the PV module reveals a non-planar profile. For instance, PV modules according to some embodiments may be fabricated to have a convex or concave curvature (with respect to the front, or light-facing, surface of the module), or some other non-planar shape, e.g., to fit various desired deployment geometries. For instance, FIG. 2a illustrates a PV module 290 having concave geometry. Such a module could be produced from flexible and/or shaped components (e.g., flexible or shaped front sheet 291 and flexible TPV-based back sheet 295 sandwich the PV cells 293 encapsulated in the encapsulant 292. TPV-based back sheets according to various embodiments herein therefore open up many possibilities for flexible PV module design. Further, PV modules according to yet other embodiments may be or include hinged PV modules. An example of a hinged PV module according to some such embodiments is shown in FIG. 2b, in which one continuous TPV-based back sheet 200, having hinged location 205, is coupled to two rigid PV module assemblies 210 and 220, each comprising (respectively) first and second front sheets 211 and 221 layered atop first and second encapsulants 213 and 223, each encapsulating first and second sets of PV cells 215 and 225. Each PV module assembly may further include a side frame that frames the sides of the PV module assembly (not shown in FIG. 2b). More than one hinged location along the TPV-based back sheet could be present in yet other embodiments, allowing for coupling of the TPV-based back sheet to three or more relatively rigid PV module assemblies. Furthermore, it will be appreciated that the hinged location 205 of various of these embodiments (as shown in FIG. 2b and otherwise) need not be fixed at a particular angle (e.g., at the angle shown in FIG. 2b); the TPV-based back sheet 200 may be readily deformed (e.g., folded or unfolded with respect to, e.g., the configuration shown in FIG. 2b) in order to increase or decrease the angle at the hinged location 200, or even to flatten it, or even to fold both the first and second PV assembly into each other (e.g., for storage or transport).

Figure 2C:
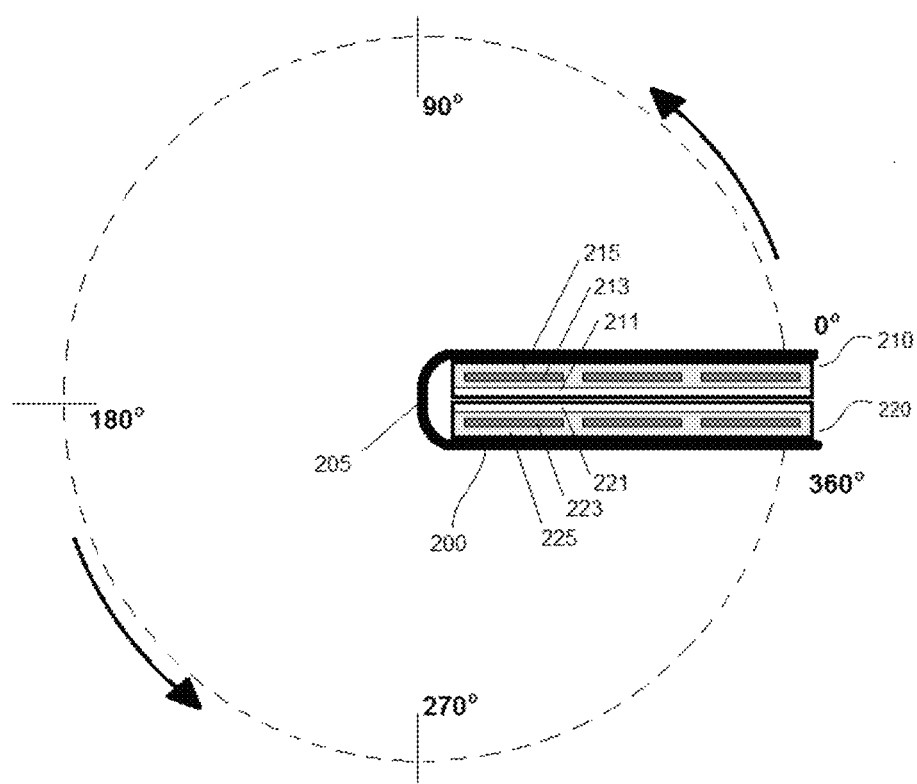
FIG. 2c is a side-view illustration showing the folding range of a hinged PV module in accordance with some embodiments of the present disclosure.
Figure 2D:
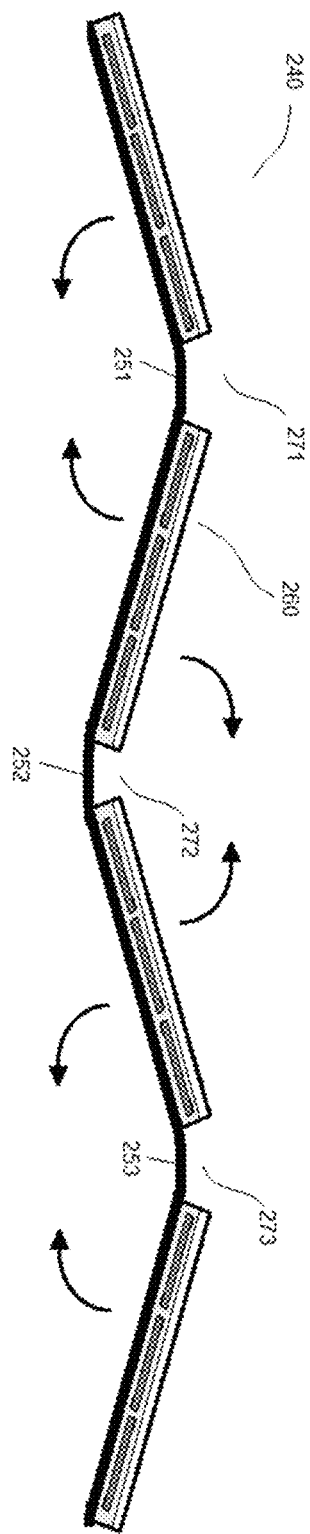
FIG. 2d is a side-view illustration of a hinged PV module in accordance with some embodiments of the present disclosure.

Thus, as illustrated in FIG. 2d, some embodiments further provide PV modules (e.g., PV module 240 of FIG. 2d) having a single continuous TPV-based back sheet 251 with a plurality of PV module assemblies 260 disposed thereon. Each assembly 260 may be per the example first and second assemblies 210 and 220 described above in connection with FIG. 2b. The assemblies 260 are disposed along the back sheet 251, preferably on the same side of back sheet 251, with a hinge space between each (e.g., spaces 271, 272, 273), each hinge space corresponding to a hinged location (e.g., 251, 252, 253, respectively) along the back sheet. A hinge space "corresponds to" a hinge location when, as illustrated in FIG. 2d, the hinge space (e.g., space 271) is proximal to the hinge location (e.g., location 251) in a manner that allows the hinge location to (i) define an angle between the front sides of the two PV module assemblies on either side of the hinge space, and/or (ii) be variably folded along the hinge location, so as to define a variable angle between the front sides of the two PV module assemblies on either side of the hinge space. Examples of such angles are illustrated between each PV module assembly 260 in FIG. 2d; furthermore, folding so as to define a variable angle at each hinged location 251, 252, and 253 is illustrated in FIG. 2d by the movement arrows (showing the module 240 being folded accordion-style). Alternatively, such hinged locations could enable the module to be extended and flattened (e.g., by folding along the axis of each hinged location opposite the directions indicated in FIG. 2c).

In sum, then, each hinged location is capable of being folded variably so as to define an angle between the front face of two adjacent PV module assemblies, said angle ranging from approximately 0° to 360°, as illustrated in FIG. 2c by the dashed line showing unfolding of the back sheet 200 along hinged location 205, such that PV module assembly 220 is held stationary while PV module assembly 210 is unfolded along the path illustrated by the dashed line of FIG. 2c. As used herein in context of an angle defined by a hinged location, the 0° angle configuration is illustrated by the positioning of the first and second PV module assemblies 210 and 220 in FIG. 2c (i.e., 0° angle is defined as the configuration in which the PV module is folded in on itself about a given hinged location, such that the front faces of the two PV module assemblies adjacent to the hinged location face each other). Accordingly, the 180° angle configuration defines a flat layout of the PV module about a given hinged location such that the front surfaces of the PV module assemblies adjacent to the hinged location both face in the same direction; and the 360° angle configuration defines a layout in which the front surfaces of the two PV module assemblies adjacent to the given hinged location face away from each other. These angular definitions are marked along the circular path of folding/unfolding illustrated in FIG. 2c. The TPV-based back sheet advantageously allows for such variable geometries while doubling as the back sheet (i.e., while still serving the functions of a conventional PV module back sheet).

Further, the single continuous TPV-based back sheets of some such embodiments can be formed to advantageously have varying thicknesses along the length of the sheet. For instance, additional calendaring or other pressing can be used to make the TPV-based back sheet thinner at hinged locations (e.g., hinged locations 251, 252, and 253 as shown in FIG. 2d), enabling easier folding at such locations, while allowing for greater relative rigidity at locations of the back sheet coupled to a PV module assembly. In certain such embodiments, each hinged location of the continuous TPV-based back sheet may have average thickness that is 90% or less, preferably 80% or less, or even 75% or less, the average thickness of the non-hinged locations of the continuous TPV-based back sheet.

Another advantage of TPV materials, as set forth in more detail below, is that such are chemically stable insofar as they are already cross-linked, as compared to some back sheet layer materials (such as EVA) that contain cross-linkable polymeric material. Such conventional material have a shorter shelf-life—e.g., in a PV module manufacturer's facility—due to the likelihood of some cross-linking occurring due to exposure to heat, moisture, and the like over time. By having longer shelf life, the TPV-based back sheets of various embodiments help reduce storage costs and result in a lower scrap rate for manufacturers.

TPV-based back sheets also offer opportunities for part integration with the PV module. For instance, parts (connectors, structures, other materials) could be molded directly onto the back-sheet. The thermoplastic nature of the TPV would enable ready repair and/or replacement of these integrated parts.

Advantageously, the back sheet according to some embodiments contains only a single layer comprising (or consisting essentially of, or consisting of) the TPV. This is a significant simplification as compared to some conventional back sheets, which constitute multiple layers (e.g., two or more of polyamide layers, PET layers, PVF layers, PVDF layers, PE layers, and EVA layers).

Nonetheless, yet further embodiments may instead comprise a multilayer back sheet, with at least one layer comprising a TPV (e.g., a TPV-based back sheet that is a multilayer composite). The TPV-based back sheet of such embodiments may be a multilayer composite that, advantageously, can substitute for the encapsulant and back sheet of conventional PV modules. Thus, the PV module of such embodiments comprises one or more PV cells at least partially encapsulated in the multilayer composite. The multilayer composite comprises a first layer (comprising the TPV) and a second layer comprising any material that is suitable as a back encapsulant material (discussed previously). By combining the encapsulant and back sheet functions (and material) in this manner, the multilayer composite still provides some simplification over conventional PV modules, particularly in the PV module manufacturing process, by allowing for direct encapsulation of the PV cells by the back sheet without the need for a separate intervening encapsulant layer. Furthermore, the same supplier would be able to provide the multilayer composite, eliminating the need for the PV module manufacturer to coordinate size and other compatibility issues between separate back sheet and encapsulant layer suppliers.

Similarly, in yet further embodiments, a multilayer TPV-based back sheet can include one or more layers of different material from the aforementioned encapsulant material, either on the front or back side of the TPV layer of the multilayer sheet. For instance, other polymeric layers, comprising materials such as thermoplastics (e.g., polyethylene or polypropylene layers), could be included on either or both sides of a TPV layer in such multilayer composites. Such polymeric layers could provide targeted protection against one or more expected environmental contaminants, such as moisture, and the like.

Thus, PV modules according to some embodiments include one or more additional protective layers disposed on either or both of the front and back sides of the TPV-based back sheet, and/or a TPV-based back sheet may be a multilayer composite.

Suitable TPVs for Forming TPV-Based Back Sheets

Thermoplastic vulcanizates (TPVs) suitable for forming the back sheets of various embodiments comprise an at least partially vulcanized rubber component dispersed in a continuous thermoplastic matrix comprising a thermoplastic component. In some embodiments, the rubber component is preferably fully vulcanized, or fully cured. Further, the rubber component is preferably present in the thermoplastic matrix in the form of finely-divided and well-dispersed particles.

Such TPVs are formed by dynamically vulcanizing a TPV formulation. The TPV formulation comprises (i) a rubber component, (ii) a thermoplastic component, (iii) a vulcanizing agent or curative; (iv) processing oil; and (v) optionally, one or more additives (including, e.g., cure accelerators, metal oxides, acid scavengers, flame retardants, fillers, stabilizers, and the like). The TPV may therefore be alternatively characterized as the product of dynamic vulcanization of the TPV formulation.

Formation of the TPV and its resultant properties will first be described, followed by a more detailed description of suitable rubber components, thermoplastic components, vulcanizing agents, processing oil, and additives.

As those skilled in the art appreciate, dynamic vulcanization includes a process whereby a rubber that is undergoing mixing with a thermoplastic resin is cured. The rubber is crosslinked or vulcanized under conditions of high shear at a temperature above the melting point of the thermoplastic resin. As a result of the process, the thermoplastic resin becomes the continuous phase of the mixture and the rubber becomes dispersed as a discontinuous phase within the continuous thermoplastic phase. Thus, in some embodiments, the mixture (e.g., the TPV formulation) undergoes a phase inversion during dynamic vulcanization, where the blend, which initially includes a major volume fraction of rubber, is converted to a blend where the plastic phase is the continuous phase and the rubber is simultaneously cross-linked and dispersed as fine particles within the thermoplastic matrix.

In general, the dynamic vulcanization of the TPV formulation takes place within a reactor. Furthermore, not all components of the TPV formulation need necessarily be introduced to the reactor at the same time.

For instance, dynamic vulcanization according to some embodiments proceeds as follows: The rubber component and thermoplastic component are mixed to form a blend, which may be referred to as a solids blend (although not all components of the blend need necessarily be in the solid state). Optional solid additives, such as cure accelerator, fillers, zinc oxide, and miscellaneous solids such as pigments and antioxidants, may be added to the solids blend. The blend is continually mixed at a temperature above the melt temperature of the thermoplastic resin to form a molten blend. The vulcanizing agent (e.g., curative), which may be in the form of a solid or a liquid, is introduced to molten blend to form a vulcanizable blend. Heating and mixing continues in order to effect dynamic vulcanization.

Processing oil can be introduced at any stage, or in multiple stages, of the process. For example, oil can be added to the solids blend, to the molten blend, together with the curative, or after dynamic vulcanization—or at any two or more of the foregoing points in the process.

Following dynamic vulcanization, mixing may continue and additional additives or ingredients can be incorporated into the molten product, which may be referred to as a molten thermoplastic vulcanizate. For example, post vulcanization additives, such as acid scavengers, can be added to the molten mass following dynamic vulcanization. The product can then be extruded through an extruder die, or otherwise fabricated, and ultimately cooled for handling and/or further processing. For example, the molten thermoplastic vulcanizate composition may be cooled and/or solidified and subsequently pelletized for future storage and/or shipment. Practice of the present invention is not necessarily limited by the manner in which the thermoplastic vulcanizate composition is subsequently solidified or fabricated, prior to the formation into back sheet material.

The process of dynamic vulcanization as described herein can take place in a continuous mixing reactor, which may also be referred to as a continuous mixer. Continuous mixing reactors may include those reactors that can be continuously fed ingredients and that can continuously have product removed therefrom. Examples of continuous mixing reactors include twin screw or multi-screw extruders (e.g., ring extruder). Methods and equipment for continuously preparing thermoplastic vulcanizates are described in U.S. Pat. Nos. 4,311,628; 4,594,390; 5,656,693; 6,147,160; and 6,042,260, as well as WO 2004/009327 A1, which are incorporated herein by reference, although methods employing low shear rates can also be used. The temperature of the blend as it passes through the various barrel sections or locations of a continuous reactor can be varied as is known in the art. In particular, the temperature within the cure zone may be controlled or manipulated according to the half-life of the curative employed.

The resulting TPV is further processed into suitable back sheets through post-processing such as extrusion and calendaring, in which TPV bales, pellets, strips, or the like are heated sufficiently to melt the thermoplastic phase, extruded, and pressed into sheets of desired thickness. Any additive suitable for inclusion directly into the TPV (discussed in more detail below) may also or instead be added at this post-processing stage, such additives including UV stabilizers, flame retardants, pigmentation agents (e.g., white or black pigmentation agents), and the like. Preferred TPVs for forming into back sheets exhibit one or more of the properties described immediately below.

Suitable TPVs according to some embodiments have hardness ranging from 30 Shore A to 50 Shore D. In particular of these embodiments, hardness may be greater than 55 Shore A, preferably greater than or equal to 60, 65, 70, 75, or 80 Shore A. Such embodiments may exhibit advantageous processing capabilities, particularly in forming suitably thin TPV-based back sheets (e.g., those having thickness in accordance with various embodiments of TPV-based back sheets previously described). For instance, TPVs having hardness according to such embodiments may allow for extrusion into relatively stress-free sheets (i.e., sheets with low internal stress). Low internal stress in the back sheet can be important during the long lifetime of the PV module, particularly when subjected to hot and/or humid operating conditions, and/or subjected to cyclical temperature changes (day-night and seasonal cycles). When the back sheet has too great an internal stress (e.g., when formed from softer TPVs), it may delaminate from the encapsulant in the PV module or rupture, causing degradation or even failure of the module. While the risk of this problem could be reduced through the use of thicker back sheets, this solution is impractical insofar as it greatly increases the materials cost of the PV modules, and further increases the weight (and therefore transportation and/or installation costs) of those modules, while undesirably decreasing flexibility of such modules. In general, the thinner the TPV sheet can be made without breakage, and while still maintaining adequate flexibility, the better.

Hardness is determined in accordance with ISO 868, which is hereby incorporated by reference. To the extent different testing equipment might yield different results following the same protocol under ISO 868, hardness should be determined using equipment in accordance with the specifications of ISO 7619 (and in compliance with former standard DIN 53505).

Suitable TPVs also or instead may have modulus at 100% elongation ("M100") within the range from 1 to 15 mPa, more preferably within the range from 1 to 10 mPa. In certain embodiments, M100 may be within the range from 1 to 6 mPa. The M100 measures the force required to maintain a sample of the TPV at 100% elongation, per cross-sectional area of the un-elongated sample, and is indicative of suitable flexibility. Specifically, the lower the M100, the more flexible the TPV material.

M100 is determined according to ISO 37, with the following modifications/clarifications: With respect to sample preparation, the direction of sample cut should be perpendicular from the direction of flow of TPV to form the plaque from which the sample is cut; further, Die Type I (ISO 37, same as Die C of ASTM D412) should be used to make the cut of the dumbbell-shaped sample. Although ISO 37 specifies sample conditioning of 23+/−2° C. for a minimum of 3 h, preferably, conditioning is constant at 23° C. for 16 h (this is also the test temperature). With respect to equipment used in elongation testing, preferably the equipment is a T10 Tensometer (Alpha Technologies) or equivalent (e.g., Zwick Z2.5/TH1s) with extensometer, foot pedal guard, and clamp guards. Further, ISO 37 specifies that test results should be determined as the median of at least 3 values; for purposes herein, the median is preferably taken from 3 values, to the nearest 0.05 MPa for materials with Shore A hardness (to the nearest 0.01 MPa for materials with Shore D hardness, where hardness is determined as previously described).

Rubber Component

The rubber component of the TPV formulation is preferably a crosslinkable (vulcanizable) rubber component. Upon dynamic vulcanization, the rubber component in the resulting TPV (i.e., resulting from processing, including by dynamic vulcanization, of the TPV formulation) is at least partially crosslinked, preferably fully crosslinked.

Any rubber suitable for use in the manufacture of TPVs can be used to manufacture (and be present in) the TPVs of some embodiments of the present invention. The term "rubber" refers to any natural or synthetic polymer exhibiting elastomeric properties, any may be used herein synonymously with "elastomer." The rubber component may comprise one rubber, or a mix of two or more rubbers.

The rubber component is preferably present in the TPV formulation (and/or present in the resulting TPV) in an amount ranging from 10-45 wt % (such as 15-40, 20-35, or 25-30 wt %), based on total weight of the TPV formulation or the TPV, as applicable. Desirable ranges may include ranges from any lower limit to any upper limit. Alternatively, in terms of wt % based on total weight of polymer content in the TPV formulation or resulting TPV (such polymer content consisting of the rubber component and the thermoplastic component), the rubber component is preferably present in an amount ranging from 40-75 wt %, such as 45-70 wt % or 50-65 wt %, where desirable ranges may include ranges from any lower limit to any upper limit.

Non-limiting examples of rubbers include olefin-containing rubbers, butyl rubber, natural rubber, styrene-butadiene copolymer rubber, butadiene rubber, acrylonitrile rubber, halogenated rubbers such as brominated and chlorinated isobutylene-isoprene copolymer rubber, butadiene-styrene-vinyl pyridine rubber, urethane rubber, polyisoprene rubber, epichlorohydrin terpolymer rubber, polychloroprene rubber, and mixtures thereof.

In some embodiments, the TPV comprises olefin-containing rubbers, such as ethylene-α-olefin copolymer rubbers. The ethylene-α-olefin rubber may contain an α-olefin having 3 to 8 carbon atoms, and in preferred embodiments the α-olefin is propylene. The ethylene-α-olefin rubber may contain at least 50 wt %, or at least 55 wt %, or at least 60 wt % of ethylene-derived units based on the weight of the ethylene-α-olefin rubber, with the balance of the units being α-olefin derived. Ethylene-α-olefin rubbers, such as ethylene-propylene rubbers, are further described in U.S. Pat. No. 5,177,147.

In preferred embodiments, the rubber component comprises an ethylene-α-olefin-diene rubber. The ethylene-α-olefin-diene rubber may contain an α-olefin having 3 to 8 carbon atoms. In preferred embodiments the α-olefin is propylene, and the rubber is an ethylene-propylene-diene rubber ("EPDM"). Preferably the diene in the ethylene-α-olefin-diene rubber is a nonconjugated diene. Suitable nonconjugated dienes include 5-ethylidene-2-norbornene ("ENB"); 1,4-hexadiene; 5-methylene-2-norbornene; 1,6-octadiene; 5-methyl-1,4-hexadiene; 3,7-dimethyl-1,6-octadiene; 1,3-cyclopentadiene; 1,4-cyclohexadiene; dicyclopentadiene ("DCPD"); 5-vinyl-2-norbornene ("VNB"); divinyl benzene; or combinations thereof. In some embodiments, the ethylene-α-olefin-diene rubber comprises diene-derived units derived from ENB, VNB, or combinations thereof. In preferred embodiments, the ethylene-α-olefin diene rubber consists essentially of, or consists only of, units derived from ethylene, propylene, and ENB.

The ethylene-α-olefin-diene rubber may comprise from 50 to 90 wt % ethylene-derived units, such as 55 to 80 or 60 to 70 wt % ethylene-derived units, based on the weight of the ethylene-α-olefin-diene rubber, where desirable ranges may include ranges from any lower limit to any upper limit. The ethylene-α-olefin-diene rubber may further comprise from 0.1 to 10 wt % (such as 3 to 7, or 4 to 6 wt %) diene, based on the weight of the ethylene-α-olefin-diene rubber, where desirable ranges may include ranges from any lower limit to any upper limit. The balance of the ethylene-α-olefin-diene rubber's monomeric content will generally be comprised of units derived from α-olefins, such as propylene. Furthermore, suitable rubbers, including suitable ethylene-α-olefin-diene rubbers, may be oil extended (that is, they may include extender oil in addition to the monomeric content).

Useful ethylene-α-olefin rubbers and ethylene-α-olefin-diene rubbers include some grades of rubbers commercially available under the tradenames Vistalon™ (ExxonMobil Chemical Co.; Houston, Tex.), Keltan™ (DSM Copolymers), Nordel™ IP (Dow), Nordel™ MG (Dow), Royalene™ (Lion Copolymer), and Buna™ (Lanxess).

Thermoplastic Component

The thermoplastic component of the TPV (and/or of the TPV formulation) includes at least one olefinic thermoplastic resin. The "olefinic thermoplastic resin" may be any material that is not a "rubber" as described herein. For example, the thermoplastic resin may be a polymer or polymer blend considered by persons skilled in the art as being thermoplastic in nature, e.g., a polymer that softens when exposed to heat and returns to its original condition when cooled to room temperature. The olefinic thermoplastic resin component may contain one or more polyolefins, including polyolefin homopolymers and polyolefin copolymers.

In some embodiments, the thermoplastic component may be present in the TPV formulation (and/or in the resulting TPV) in an amount of from 10 wt % to 30 wt %, such as 14-28 or 16 to 25 wt %, where the wt % is based on total weight of the TPV formulation (and/or resulting TPV, as applicable), and desirable ranges may include ranges from any lower limit to any upper limit. Alternatively, put in terms of wt % based on total weight of polymer content in the TPV formulation or resulting TPV, the thermoplastic component is preferably present in an amount ranging from 25-60 wt %, such as 30-55 or 35-50 wt %, where desirable ranges may include ranges from any lower limit to any upper limit.

Illustrative thermoplastic resins may be prepared from mono-olefin monomers including, but not limited to, monomers having 2 to 7 carbon atoms, such as ethylene, propylene, 1-butene, isobutylene, 1-pentene, 1-hexene, 1-octene, 3-methyl-1-pentene, 4-methyl-1-pentene, 5-methyl-1-hexene, mixtures thereof, and copolymers thereof. Preferably, the olefinic thermoplastic resin is unvulcanized or non cross-linked in the resulting TPV (i.e., it is non-vulcanizable or non-crosslinkable as present in the TPV formulation, prior to dynamic vulcanization).

In preferred embodiments, the olefinic thermoplastic resin comprises, or consists of, polypropylene. The term "polypropylene" as used herein broadly means any polymer that is considered a "polypropylene" by persons skilled in the art and includes homo, impact, and random copolymers of propylene. Preferably, the polypropylene used in the TPVs described herein has a melting point above 110° C. and includes at least 90 wt % propylene-derived units. The polypropylene may also include isotactic, atactic or syndiotactic sequences, and preferably includes isotactic sequences. The polypropylene can either derive exclusively from propylene monomers (i.e., having only propylene-derived units) or comprises at least 90 wt %, or at least 93 wt %, or at least 95 wt %, or at least 97 wt %, or at least 98 wt %, or at least 99 wt % propylene-derived units, with the remainder derived from olefins, such as ethylene, and/or $C_4$-$C_{10}$ α-olefins.

The thermoplastic resin may have a melting temperature of at least 110° C., or at least 120° C., or at least 130° C., and may range from 110° C. to 170° C. or higher as measured by DSC as described in Col. 20, lines 35-53 of U.S. Pat. No. 6,342,565, incorporated by reference herein.

Other Components of the TPV

TPVs (and TPV formulations used in making the TPVs) may further comprise oil, including process oil (added to the TPV formulation) and/or extender oil (which may be present in the rubber component included in the TPV formulation). The oils that may be used include hydrocarbon oils and plasticizers, such as organic esters and synthetic plasticizers. Many additive oils are derived from petroleum fractions, and have particular ASTM designations depending on whether they fall into the class of paraffinic, naphthenic, or aromatic oils. Other types of additive oils include alpha olefinic synthetic oils, such as liquid polybutylene. Additive oils other than petroleum based oils can also be used, such as oils derived from coal tar and pine tar, as well as synthetic oils, e.g., polyolefin materials. In particular embodiments, oil included in the TPV is selected based on API groupings (e.g., a API Group I, Group II, Group III, Group IV, or Group V base stock oil may be used as the oil in the TPV). In particular embodiments, oil included in the TPV comprises Group II or higher oil, such as Group II oil (e.g., ParaLux™ 6001R process oil, available from ChevronTexaco Corp.). Also or instead, the oil could include white oil (e.g., pharmaceutical grade oil, such as Primol™ 542 medicinal grade white oil, available from ExxonMobil Chemical Company, Baytown, Tex.). Preferably, the oil is substantially colorless. In certain embodiments, at least 90 wt %, preferably 95 wt %, more preferably 99 wt %, of the oil in the TPV is substantially colorless. Color of oil may be determined in accordance with ASTM D1500; preferably, a "substantially colorless" oil measured under this scale has color value of less than 0.5 on the ASTM D1500 color scale. ASTM D156, employing the Saybolt color scale, is particularly suited for refined, nearly colorless oils; therefore, a "substantially colorless" oil preferably has Saybolt color value of +20 to +30, as determined by ASTM D156.

Oil can be present in the TPV in an amounts of from about 5 to about 300 parts, or from 30 to 250 parts, or from 70 to 200 parts, by weight per 100 parts by weight of total weight of the rubber component and thermoplastic component, where desirable ranges may include ranges from any lower limit to any upper limit. Put in other terms, in some embodiments, oil may be present in the TPV in an amount of from a low of about 10 wt %, or 15 wt %, or 20 wt %, or 25 wt %, or 30 wt %, to a high of about 40 wt %, or 45 wt %, or 50 wt %, or 55 wt %, based on the total weight of the TPV, where desirable ranges may include ranges from any lower limit to any upper limit.

The TPV formulation also includes a vulcanizing agent, which may be at least in part consumed during dynamic vulcanization of the TPV formulation. Any vulcanizing agent that is capable of curing or crosslinking the rubber employed in preparing the TPV may be used. For example, where the rubber includes an olefinic elastomeric copolymer, the cure agent may include peroxides, phenolic resins, free radical curatives, or other curatives conventionally employed. In some embodiments, the vulcanizing agent comprises a phenolic resin. Cure accelerators (e.g., metal halides such as stannous chloride) may be used in the TPV formulation in conjunction with the vulcanizing agent. Particularly useful vulcanizing agents, including phenolic resins, and cure accelerators, including stannous chloride, are described in Paragraphs [0046]-[0054] of PCT Application No. PCT/US15/65048, filed Dec. 10, 2015, which description is herein incorporated by reference.

The TPV formulation may also include one or more additives, including metal oxides, acid scavengers, reinforcing and non-reinforcing fillers and/or extenders, antioxidants, stabilizers, antiblocking agents, anti-static agents, waxes, foaming agents, pigments, flame retardants, and any other additive, such as processing aids known in the rubber compounding art. Useful fillers and extenders include conventional inorganics such as calcium carbonate, clays, silica, talc, titanium dioxide, carbon black, as well as organic and inorganic nanoscopic fillers. Suitable additives are described in Paragraphs [0055]-[0061] of International Application No. PCT/US15/65048, filed Dec. 10, 2015, which description is herein incorporated by reference.

In some embodiments, particularly useful additives include one or more of UV stabilizers, UV inhibitors, antioxidants, and flame retardants, any one or more of which may be desired in the PV module back sheet applications into which the TPV is to be deployed. Useful flame retardants are described in Paragraphs [0043]-[0048] of WIPO Publication No. WO 2012/030577, which description is herein incorporated by reference. Useful UV stabilizers include phenol-containing UV-inhibitors, UV-stabilizers, and antioxidants, as well as hindered amine light stabilizers. Carbon black, which can serve as a black pigmentation agent, may also provide useful UV stabilization properties.

In yet other embodiments, however, the TPV may be substantially devoid of one or more of flame retardants, UV stabilizers, UV inhibitors, and anti-oxidants, other than carbon black. "Substantially devoid" in this context refers to an absence of more than a negligible amount of the additive. In particular embodiments, any one or more of the additives is present in the TPV at no more than 0.1 wt %, preferably no more than 0.05 wt %, by weight of the TPV. In particular embodiments, the TPV contains no more than 0.1, preferably no more than 0.05 wt % flame retardants. In yet further embodiments, the TPV also or instead contains no more than 0.1 wt % combined, preferably no more than 0.05 wt % combined, of UV stabilizers, UV inhibitors, and antioxidants, other than carbon black.

Furthermore, a desired TPV additive according to yet further embodiments includes a white pigmentation agent, such as colored clays, titanium dioxide (which can also exhibit useful flame retardant properties), or other compounds suitable for imparting white color to the TPV, which may advantageously increase reflectance of electromagnetic energy contacting the back sheet. This could be particularly useful in embodiments wherein the back encapsulant material is at least partially transparent, such that any EM radiation (e.g., light) that bypasses the PV cells is reflected back, at least in part, to the PV cells for potential collection and conversion to electrical energy.

Another potentially useful class of additives includes functionalized polymers, e.g., maleic anhydride graft polyethylene (PE-g-MA) or polypropylene (PP-g-MA). Preferred functionalized polymers that may be used are described in WO 03/025084, WO 03/025037, WO 03/025036, and EP Patent No. 1 295 926, all of which are incorporated by reference herein. Such functionalized polymers would be present in the TPV's thermoplastic phase, and in some embodiments improve the adhesive strength of a back sheet formed from the TPV (e.g., to improve lamination to an encapsulant).

Formation of PV Modules

In some aspects, the present disclosure also relates to formation of PV modules in accordance with previously described modules.

PV modules may be formed by conventional methods in which the TPV-based back sheet is advantageously substituted in place of conventional back sheets. Thus, in some embodiments, formation includes heating (annealing) a stack of PV module layers. Preferably, the layers include, as illustrated in FIG. 1, at least a front encapsulant layer 105, an array of PV cells 110, a back encapsulant layer 115, and a back sheet 120. The layers are arranged in the order as shown in FIG. 1, such that the front encapsulant layer 105 and back encapsulant layer 115 sandwich the PV cell array 110, and the back encapsulant layer 115 is further adjacent to, and in contact with, the back sheet 120. In accordance with the illustration of FIG. 1, a front sheet 101 is optionally included adjacent to, and in contact with, the front encapsulant layer 105.

The foregoing layers are preferably stacked in reverse order (i.e., such that the front sheet 101 is on bottom, and the back sheet 120 is on top) and heated (e.g., in an autoclave). Preferably, the front and back encapsulant layers 105 and 115 include cross-linkable polymeric material, and the heating is such that the encapsulant materials flow around the PV cell(s) and are cross-linked, adhering to the front sheet 101, the cells 110, and the back sheet 120. Suitable heating temperatures may vary depending upon the identity of the encapsulant, but in some embodiments, the stack of PV module layers is preferably heated to a temperature within the range of 90° C. to 250° C., such as 150° C. to 250° C., e.g., 150° C. to 200° C., with contemplated ranges including any lower limit to any upper limit.

In other embodiments, the PV module layers may be stacked top-to-bottom (e.g., with the back sheet 120 on bottom and front sheet 101 on top), or arranged side-to-side (e.g., with the back sheet 120 on one end and the front sheet 101 on the other end), so long as the layers are arranged in the order: front sheet—front encapsulant layer—PV cell array—back encapsulant layer—back sheet.

In embodiments in which the TPV-based back sheet is a multilayer composite (e.g., including an encapsulant layer), the back encapsulant layer 115 in the foregoing description is simply omitted, so as to allow the multilayer composite back sheet to contact the PV cell array 110 during formation.

Likewise, in embodiments in which one or more additional layer(s) are present on either side of the TPV-based back sheet, such layers may be correspondingly included in the stack of PV module layers in front of (on top of) and/or behind the back sheet, prior to heating.

Whatever layers are included, either before or after heating of the stack of PV module layers, side frames (and optionally sealant) may in some embodiments also be included to cover the sides of the stack, arranged as shown for side frames 130 and sealant 131 shown in FIG. 1. A wire or other electrical conduit for electrically coupling the PV cells 110 to external electrical charge-carrying means (e.g., junction box 111 or other electrical conducting means) may further be coupled with the PV cell(s) prior to assembly of the side frames 130 and/or sealant 131. It is further noted that this description of finishing the PV assembly (e.g., electrically coupling the PV cell(s) to external charge conducting means and providing any further structural support) is provided as simply one example of many. Finishing of the assembly comprising the previously-described stack of PV module layers may in general be accomplished by any means known in the art.

In some embodiments, the TPV undergoes substantially no crosslinking during the heating step of assembly. For purposes of determining whether "substantially no crosslinking" takes place during heating of the TPV, a first sample of the TPV can first be subjected to boiling xylene testing as described previously herein; a second sample of the TPV can be subjected to the same heating conditions as the stacked assembly, and then subjected to boiling xylene testing (following the same procedure as used for testing the first sample of the TPV). If the difference in wt % of extractable rubber in boiling xylene between the first and second TPV samples is less than 1 wt %, then it can be said that substantially no crosslinking took place during heating of the TPV.

Advantageously, such formation results in a PV module in which no adhesive layer is required between the encapsulant and back sheet. Instead, the back sheet, formed from a TPV according to the above description, is preferably adhered directly to the encapsulant without the need for adhesive.

In some preferred embodiments, the TPV back sheet is corona-treated prior to the above-described layering and heating to form the PV module. Corona treatment according to some embodiments may increase the bondable surface area on the TPV back sheet, creating a sufficiently strong bond between back sheet and encapsulant (again, advantageously, such that the TPV back sheet is at least partially adhered directly to the encapsulant, i.e., without the need for an additional adhesive material or layer between the TPV back sheet and the encapsulant). Corona treatment according to some of these embodiments may be carried out by any known means suitable for a plastic surface. It typically includes accelerating electrons to the surface of the plastic (here, the TPV). This electron bombardment removes surface impurities and also causes at least some polymer chains along the surface of the TPV to rupture, producing open ends and free valencies. At the same time, ozone may be created during generation of the electron bombardment. The ozone and/or surrounding air react with the ruptured polymer chains, producing oxygenates along the surface molecules of the TPV, which enable more ready binding to other surfaces. Typically, only the surface molecules of the TPV are affected by such corona treatment (e.g., the top 0.00001 micron of the TPV).

Alternatively, other surface modifications (e.g., treatments that modify the surface molecules of the TPV to increase surface tension of the TPV), such as plasma treatment, may be used instead or in addition to such corona treatment. Thus, in some embodiments, a TPV-based back sheets is surface-treated to improve its adhesion prior to being layered with other PV module layers and heated.

During heating of the stack of PV module layers, the encapsulant material may undergo crosslinking reactions. While such reactions are typically desired, they may generate undesired byproducts which may impair the integrity of the PV module, as noted previously. Again, per the previous description, the TPV-based back sheet according to some embodiments advantageously may allow one or more of these byproducts to escape from the internals of the module, e.g., by diffusing through the TPV-based back sheet. Thus, PV module formation methods according to some embodiments include the generation of one or more such crosslinking byproducts during heating, followed by allowing at least a portion of the one or more byproducts to escape the assembled PV module through the back sheet.

Desirable PV Module Properties

As previously noted, PV modules including TPV-based back sheets according to various embodiments advantageously exhibit improved flexibility (owing to the previously-noted improved flexibility of the TPV-based back sheet), reduced manufacturing cost, and greater durability. At the same time, such modules also advantageously either retain or improve upon properties of conventional PV modules.

For instance, PV modules according to some embodiments may have a maximum permissible system voltage of 1000 VDC or greater (preferably 1030 VDC or greater), while comprising a back sheet of average thickness 0.35 mm or less (such as a back sheet of thickness within the range from 0.10 to 0.35 mm, or 0.25 to 0.35 mm). Maximum permissible system voltage in such embodiments may be within the range from 1000 VDC to 1500 VDC, such as 1000-1200 VDC, or 1030-1200 VDC, where ranges from any upper limit to any lower limit are also contemplated. Maximum permissible system voltage is an indicator of the electrical insulation properties of the TPV-based back sheet. In particular, maximum permissible system voltage indicates the maximum voltage that can safely be observed in the PV module, without significant risk of uncontrolled electrical discharge across the insulating TPV-based back sheet and into the PV module's surroundings. Higher maximum permissible system voltage (i.e., the better the electrical insulation capabilities of the back sheet), indicates the possibility for more efficient PV operation (e.g., the capability to get more energy per square meter of PV module front surface exposed to incident electromagnetic radiation).

Further, PV modules according to some embodiments may also or instead exhibit minimal changes in PV module series resistance at one-sun illumination (Rs) after 3000 h exposure to Damp Heat conditions (85° C./85% rel. humidity) according to the protocols of IEC 61215 (except that exposure to conditions is for 3000 h, not 1000 h as stated in the current IEC 61215 standard). In particular, the change in Rs may be less than or equal to 5% in some embodiments, preferably less than or equal to 4% or even 3%. Higher increases in Rs indicate likely corrosion on the electrical contacts in the PV module, and/or mechanical damage to the cells themselves, and/or swelling of the encapsulant, and/or other failures that result in higher resistance at some point in the circuit within the PV module. Therefore, the less the increase in Rs during operation of the PV module (as simulated by Damp Heat exposure), the better.

Also or instead, PV modules according to some embodiments may exhibit minimal changes in module power output at the maximum power point (Pmpp) during D-H exposure. Preferably, after 3000 h of exposure to Damp Heat conditions (85° C./85% relative humidity) according to the protocols of IEC 61215, such PV modules of some embodiments show change greater than −5% in Pmpp (i.e., have a ΔPmpp>−5%), preferably greater than −4% or even −3%. As used in this context, a change "greater than" the recited negative numbers includes both positive changes in Pmpp (i.e., ΔPmpp>0%) and losses in Pmpp that are smaller in absolute value than 5% (i.e., ΔPmpp>−5% and <0%).

EXAMPLES

Example 1

The effect of corona treatment on back sheets formed a TPV was evaluated. First, Santoprene™ Thermoplastic Vulcanizate 251-70W232, commercially available from Exxon-Mobil Chemical Company, Houston, Tex., USA was formed into three 1.8 cm (width)×20 cm (height) sheets approximately 0.23 mm thick. The three sheets (Samples S1, S2, and S3) were respectively corona-treated for 0, 1, and 4 minutes of traveling time (meaning respective scan rates of 0, 25, and 6.25 cm/min).

In order to properly test adhesion strength of the TPV-based back sheets, it was necessary to form multi-layer test sheets that included two layers of conventional back sheet material (Ref_BS, which was ICOSOLAR™ 2442, a three-layer composite (TEDLAR™/PET/TEDLAR™ with white color on sunny side and black color on opposite side), available from Isovoltaic AG, Austria. TEDLAR™ is a PVF film available from DuPont Corporation, and PET is poly ethylene terephthalate. The more rigid conventional back sheet material allowed the peel force test to proceed in a manner that would result in controlled delamination of the TPV-based back sheets from an encapsulant layer; otherwise, the TPV-based back sheet and encapsulant would readily deform in response to the applied stress, distorting the measurement of force necessary for delamination based only upon peel strength. Thus, for adhesion testing, each of Sample S1, S2, and S3 was laminated into a multi-layer construct of the following construction: Ref_BS/EVA/TPV_BS/EVA/Ref_BS, where Ref_BS is as just described, TPV_BS is sample S1, S2, or S3, and EVA is a conventional encapsulant (PHOTOCAP™ 15580P, commercially available from Specialized Technology Resources, Inc., Enfield, Conn., USA). Lamination of the five layers together took place by heating the layered sheets to 160° C. in an autoclave. The 160° C. temperature was held for 10 minutes. Upon cooling, the multilayer test sheets were removed from the autoclave.

Figure 3:
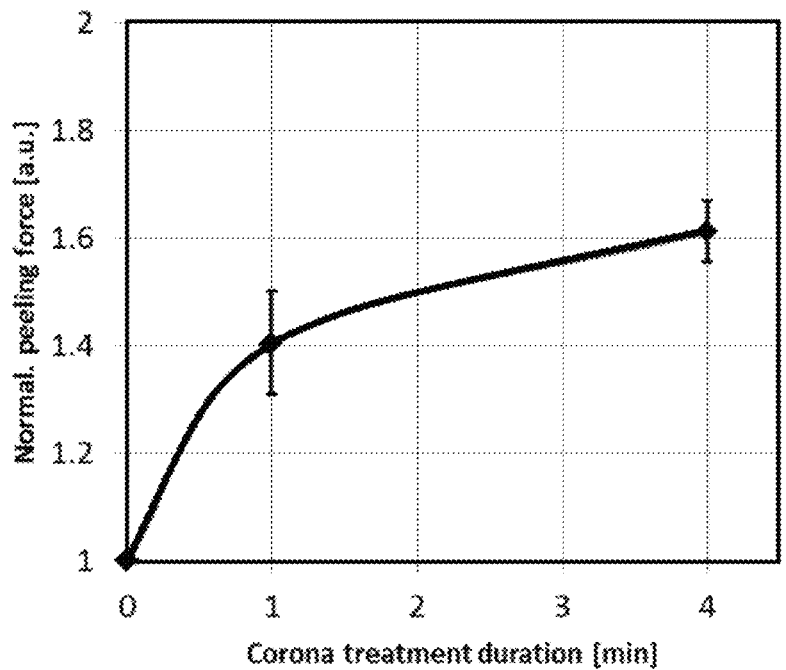
FIG. 3 is a graph illustrating normalized peeling force for various samples of TPV-based back sheets laminated to encapsulants after 0, 1, and 4 minutes of corona treatment respectively applied to the samples.

Each multi-layer test sheet was subjected to peel testing at ambient temperature of 22° C., at a peel rate of 100 mm/min. The peeling force required to cause delamination of the TPV from the EVA was recorded for each Sample. FIG. 3 illustrates the normalized peeling force required for delamination as a function of corona treatment duration (with 0 minutes of treatment, corresponding to sample S1, taken as the base value of "1"). As shown in FIG. 3, just 1 minute of corona treatment (per sample S2) increased the peeling force required for delamination by approximately 40% over the untreated sample S1, while 4 minutes of corona treatment (per sample S3) resulted in just over 60% increase in peeling force required for delamination over the untreated sample S1. In absolute values, the peeling force for sample S1 was 43.5+/−3.0 N/cm; peeling force for sample S2 was 61.1+/−4.5 N/cm; and peeling force for sample S3 was 70.0+/−2.0 N/cm (with ranges given to account for the experimental standard deviation).

Example 2

Test back sheets formed from five different materials were studied for their adhesion to EVA encapsulant under different temperature conditions, both before and after damp heat testing. The five types of back sheet tested were labeled based upon their material of construction, as shown in Table 1 below:

TABLE 1

Example 2 Back Sheets for Adhesion Testing

| Sample Label | Back sheet material | Thickness |
| --- | --- | --- |
| REF_BS | ICOSOLAR ™ 2442 | 0.36 mm |
| TPV_BS1 | SANTOPRENE ™ TPV 251-70W232 | 0.23 mm |
| TPV_BS2 | SANTOPRENE ™ TPV 101-55 | 0.30 mm |
| TPV_BS3 | SANTOPRENE ™ TPV 101-80 | 0.29 mm |
| TPV_BS4 | SANTOPRENE ™ TPV 251-80W232 | 0.28 mm |

ICOSOLAR™ 2442 is as described previously in Example 1.

SANTOPRENE™ TPV 251-70W232 is a flame-resistant, white-pigmented grade of thermoplastic vulcanizate available from ExxonMobil Chemical Company, containing cross-linked EPDM particles dispersed in a thermoplastic (polypropylene) matrix. It has hardness of 75 Shore A and M100 of 2.5 MPa.

SANTOPRENE™ TPV 101-55 is a grade of thermoplastic vulcanizate available from ExxonMobil Chemical Company, containing cross-linked EPDM particles dispersed in a thermoplastic (polypropylene) matrix. It has hardness of 59 Shore A and M100 of 2.1 MPa.

SANTOPRENE™ TPV 101-80 is a grade of thermoplastic vulcanizate available from ExxonMobil Chemical Company, containing cross-linked EPDM particles dispersed in a thermoplastic (polypropylene) matrix. It has hardness of 86 Shore A and M100 of 4.7 MPa.

SANTOPRENE™ TPV 251-80W232 is a flame-resistant, white-pigmented grade of thermoplastic vulcanizate available from ExxonMobil Chemical Company, containing cross-linked EPDM particles dispersed in a thermoplastic (polypropylene) matrix. It has hardness of 86 Shore A and M100 of 3.8 MPa.

Five-layer test sheets (dimensions 1.8 cm×20 cm) similar to those prepared in Example 1 were prepared from each of the five foregoing back sheets. The test sheets each had the construction: REF_BS/EVA/Test_BS/EVA/REF_BS, where Test_BS is either REF_BS or TPV_BS2-4 as set forth in Table 1. As with the test sheet in Example 1, test sheets were formed in this manner to impart sufficient rigidity to the construct such that the force causing delamination accurately reflects the peel strength (without elastic deformation contributing to the required delaminating force). Each of the test back sheets was corona treated for 4 minutes prior to lamination with the other test sheet layers, and lamination to form the five-layer test sheet took place by heating at 160° C. for 10 minutes.

Figure 4:
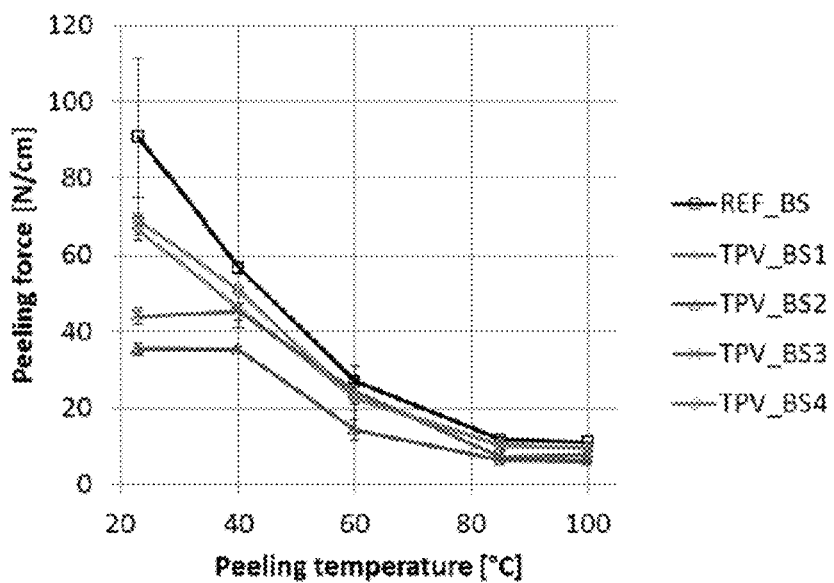
FIG. 4 is a graph illustrating peeling force required to delaminate test sheets at different temperature conditions.

Multiples of each type of five-layer test sheet were constructed, so as to evaluate each type of test sheet under many different conditions. First, peeling force for delamination of each type of five-layer test sheet (between the Test_BS layer and either EVA layer) was determined at each of 23° C., 40° C., 60° C., 85° C., and 100° C. (i.e., a total of 25 test sheets—1 of each type at each of the 5 temperature conditions—were tested). The results are shown in FIG. 4, in which it can be seen that, while the REF_BS has greater peel strength at 23° C. (about 90 N/cm, as compared to 65-70 N/cm for TPV_BS1 and 4, and 35-45 N/cm for TPV_BS2 and 3), the peel strength for all samples laminated to the EVA encapsulant was very similar at 60° C., and almost indistinguishable at 85° C. and 100° C. (5-15 N/cm for all). The internal temperatures of PV modules in operation typically range from 60° C.-80° C., at which adhesive strength for all TPV-based back sheets was similar to the reference, indicating that all such TPV back sheets tested achieved adequate adhesion to the EVA encapsulant, with no adhesive necessary.

Figure 5:
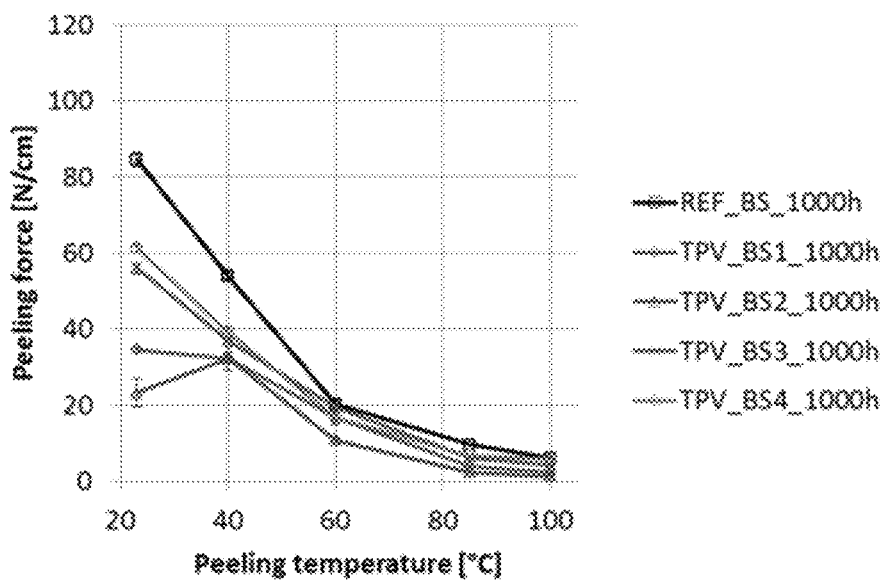
FIG. 5 is a graph illustrating peeling force required to delaminate test sheets at different temperature conditions, following exposure of the test sheets to Damp Heat conditions for 1000 h.

Further sets of each of the five-layer test sheets was tested at each temperature (23° C., 40° C., 60° C., 85° C., and 100° C.), but after 1000 h of Damp Heat (D-H) exposure. Damp Heat exposure was carried out per the protocols for Damp Heat testing in the IEC 61215 qualification test, which is incorporated by reference herein—specifically, exposure to 85% relative humidity at 85° C. for 1000 h in a climate chamber suitable for constantly maintaining the noted humidity and temperature conditions. The results are shown in FIG. 5. FIG. 5 exhibits similar trends to the adhesion strength testing done prior to 1000 hours of D-H conditions, with the REF_BS performing better at 23° C., and all samples performing similarly at 60° C. and up. However, following the D-H exposure, the reference back sheet had lower adhesive strength at 60° C., 85° C., and 100° C., as compared to the same type of sheet's adhesive strength at the same temperatures without D-H exposure (e.g., at 60° C., the REF_BS required about 28 N/cm peeling force to delaminate with no D-H exposure, but only about 20 N/cm peeling force after D-H exposure). On the other hand, the impact of D-H exposure to the TPV-based back sheets was much less pronounced (with differences of 0-4 N/cm at 60° C., 85° C. and 100° C. tests). This further emphasizes the similarity of adhesive performance between the TPV-based back sheets and the reference back sheet in actual field conditions for the PV module.

Finally, one more set of each of the five-layer test sheets were tested at each temperature (23° C., 40° C., 60° C., 85° C., and 100° C.) following 2000 h of D-H exposure (again according to IEC 61215, except for the 2000 h of exposure instead of the 1000 h called for in the standard test).

Figure 6:
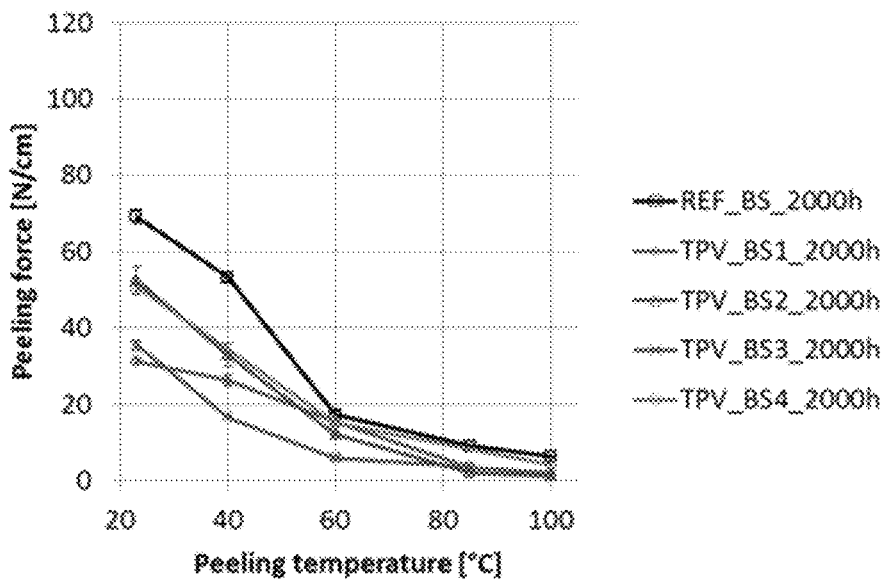
FIG. 6 is a graph illustrating peeling force required to delaminate test sheets at different temperature conditions, following exposure of the test sheets to Damp Heat conditions for 2000 h.
Figure 7:
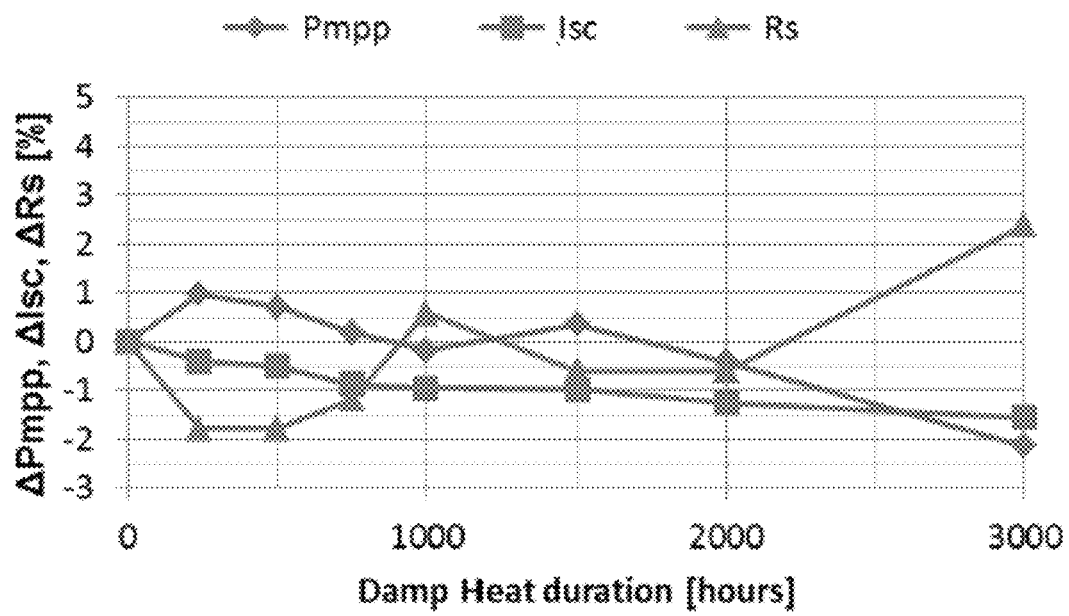
FIG. 7 is a graph illustrating changes in electrical properties of a test PV module as a function of time of exposure to Damp Heat conditions.
Figure 8:
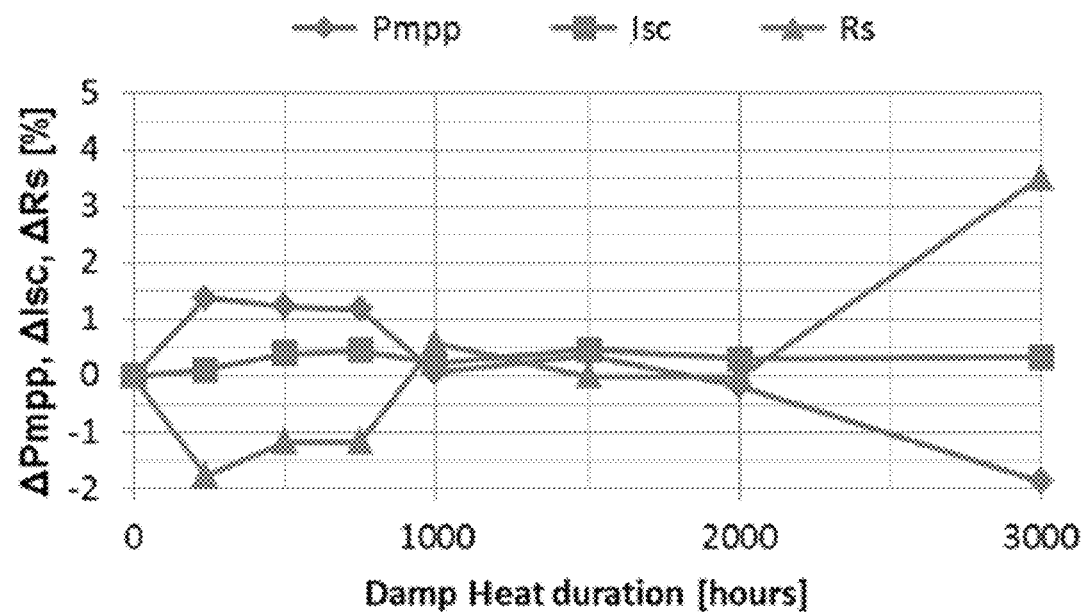
FIG. 8 is a graph illustrating changes in electrical properties of a test PV module as a function of time of exposure to Damp Heat conditions.
Figure 9:
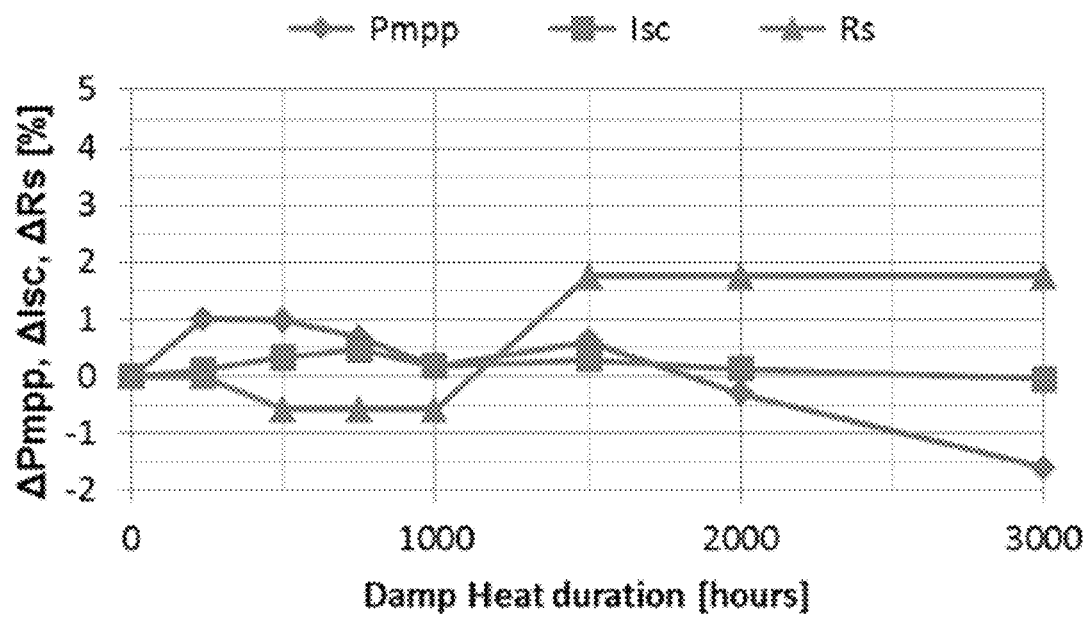
FIG. 9 is a graph illustrating changes in electrical properties of a test PV module as a function of time of exposure to Damp Heat conditions.

The results are shown in FIG. 6. As with performance after 1000 h of D-H testing, following 2000 h of D-H exposure, all TPV-based back sheets and the reference back sheet exhibited similar adhesiveness in the temperature range of typical PV cell operation (60-80° C.). However, the adhesive testing following 2000 h of D-H exposure shows some surprising trends. In particular, although most sheets exhibited declines in adhesive strength following 2000 h D-H exposure (as compared to 0 and 1000 h D-H exposure), the TPV_BS2 and TPV_BS3 test sheets actually exhibited increased adhesion strength at 23° C. after 2000 h of D-H exposure, as compared to 1000 h D-H exposure.

In addition, it was observed that the tensile strength of the REF_BS was much reduced after 2000 h of D-H exposure, which made the peel test difficult to conduct. On the other hand, the TPV_BS samples advantageously did not exhibit significant degradation in mechanical strength, including in tensile strength.

In sum, the testing shows that TPV-based back sheets provide comparable adhesive strength to incumbent back sheets, while offering significantly increased flexibility.

Example 3

Six mini PV modules (20 cm×40 cm) were fabricated, each containing 2 serially connected PV cells (Sunways mono c-Si solar cells) with a uniform coating of aluminum paste on the back side of the cells, and with the coated cells further encapsulated in EVA (PHOTOCAP™ 15580P) with glass front sheets (solar-grade float glass, 3 mm thick). The back sheet material for each sample mini module is shown in Table 2 below. The modules were fabricated by lamination at 160° C. heat for 10 minutes.

TABLE 2

Example 3 Mini PV Module Back Sheets

| Sample No. | Back sheet material | Back Sheet Thickness |
|---|---|---|
| PV1 | SANTOPRENE ™ TPV 251-70W232 | 0.23 mm |
| PV2 | SANTOPRENE ™ TPV 101-55 | 0.30 mm |
| PV3 | SANTOPRENE ™ TPV 101-80 | 0.29 mm |
| PV4 | SANTOPRENE ™ TPV 251-80W232 | 0.28 mm |
| PV5 | ICOSOLAR ™ 2442 (black sun-facing side) | 0.36 mm |
| PV6 | ICOSOLAR ™ 2442 (white sun-facing side) | 0.34 mm |

All 6 mini modules were exposed to D-H conditions in the climate chamber for 3000 h, per the protocol of IEC 61215 (except that, as noted, 3000 h exposure was used instead of the 1000 h called for in the protocol).

Example 3-1

A visual inspection was conducted to assess the extent (if any) of delamination and/or back sheet shrinkage during the Damp Heat study. Results are recorded in Table 3 below.

TABLE 3

Visual Inspection of Example 3 Mini PV Modules After Damp Heat

| Sample No. | Delamination/Mechanical Failure | Back Sheet shrinkage |
|---|---|---|
| PV1 | none | very slight |
| PV2 | mechanical failure after 2000 h (back of sheet torn open) | very slight |
| PV3 | none | very slight |
| PV4 | none | very slight |
| PV5 | none | none |
| PV6 | none | none |

The very slight shrinkage in PV1-4 developed at around 240 h into the D-H conditions, with no further change in size up to the 3000 h mark, indicating that the shrinkage was minor and contained. The shrinkage did not appear to impact PV performance.

IEC 61215 requires a successfully tested PV module to exhibit no major visual defects, as defined in Clause 7 of IEC 61215, after 1000 h of Damp Heat. Clause 7 includes the following visual defects: (a) broken, cracked, or torn external surfaces, including superstrates, substrates, frames and junction boxes; (b) bent or misaligned external surfaces, including superstrates, substrates, frames and junction boxes to the extent that the installation and/or operation of the module would be impaired; (c) a crack in a cell, the propagation of which could remove more than 10% of that cell's area from the electrical circuit of the module; and (d) bubbles or delaminations forming a continuous path between any part of the electrical circuit and the edge of the module; and E loss of mechanical integrity, to the extent that the installation and/or operation of the module would be impaired.

All tested mini PV modules pass the visual inspection of IEC 61215.

However, the TPV-based back sheet of PV2 suffered mechanical failure after 2000 h of D-H testing. This is likely due to the lower hardness of the TPV used to form this back sheet (59 Shore A) as compared to the others (75-86 Shore A), indicating the importance of using a TPV of sufficient hardness to form the thin TPV-based back sheets for enabling longer PV module life.

In addition, some yellowing of the EVA encapsulant was found to occur during the 3000 h D-H exposure in samples PV1-4. This yellowing is not considered a major visual defect under IEC 61215.

Example 3-2

Each mini PV module was also tested for electrical performance during the Damp Heat exposure. Three properties were monitored for each PV module throughout the 3000 h Damp Heat exposure: Pmpp (module power output at the maximum power point), Isc (module short-circuit current), and Rs (module series resistance at one-sun illumination). The percentage change in each value over time was recorded (i.e., such that at time t=0, each value ΔPmpp ΔIsc, and ΔRs was 0%). Less than 5% degradation in Pmpp during 1000 h of DH exposure (i.e., ΔPmpp>−5%) is a successful test under IEC 61215. Isc is the current through the PV cell when the voltage across the cell is zero (i.e., when the cell is short-circuited). This represents the theoretical maximum current obtainable across the solar cell; a higher value is better (i.e., decreases in Isc are undesirable)—therefore, as small a decrease as possible is sought for this value. On the other hand, increases in Rs are undesirable, as this tends to indicate corrosion of electrical contacts within the PV module—therefore, as small an increase as possible is sought for this value.

FIGS. 7-10 show the ΔPmpp, ΔIsc, and ΔRs for each of PV1-4, respectively (i.e., the 4 PV mini modules having TPV-based back sheets per Table 2). As shown therein, each PV module with a TPV-based back sheet not only passes IEC 61215 after 1000 h of D-H exposure; they also pass after 3000 h. Also of note: in FIG. 9, it can be seen that the Rs of PV3 increases after 1000 h, but remains very stable at just +1.8% from 1500 h to 3000 h. This is distinct from each other tested PV, where Rs shows an upward trend as of the 3000 h mark.

Figure 11:
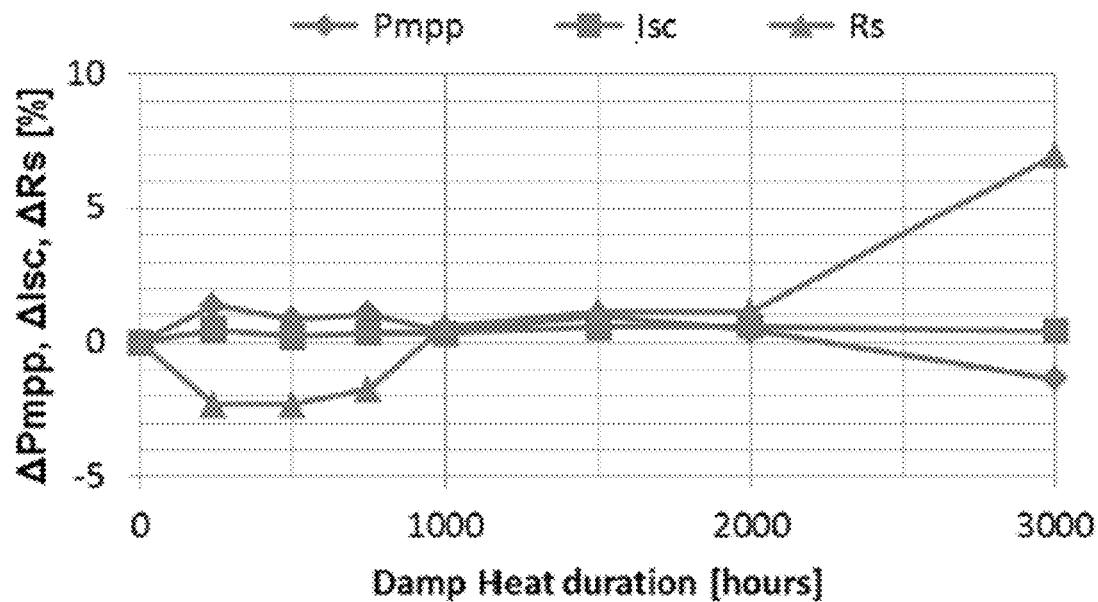
FIG. 11 is a graph illustrating changes in electrical properties of a test PV module as a function of time of exposure to Damp Heat conditions.
Figure 12:
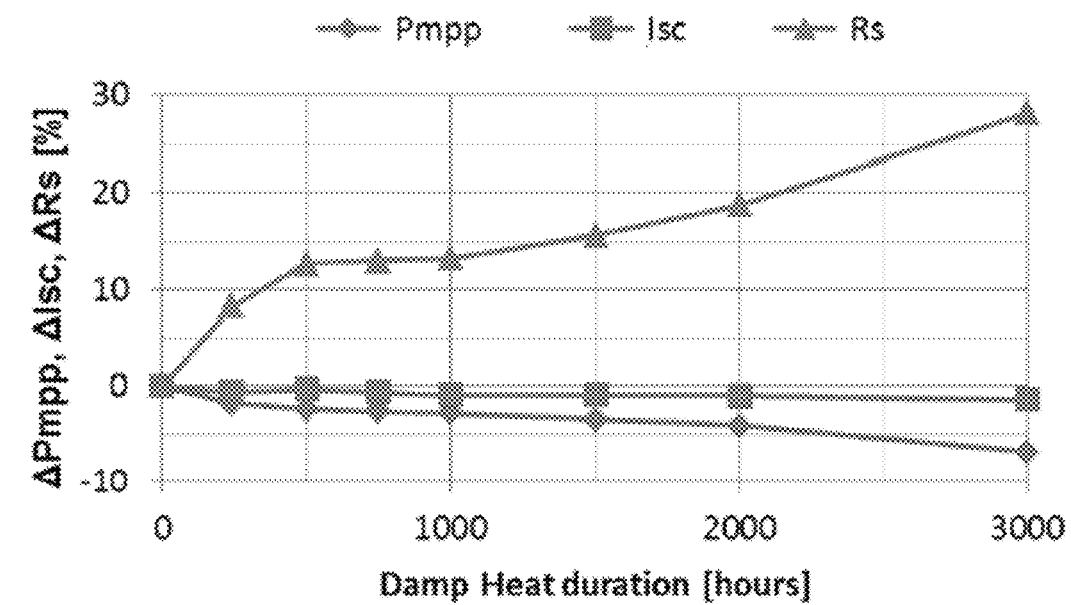
FIG. 12 is a graph illustrating changes in electrical properties of a test PV module as a function of time of exposure to Damp Heat conditions.

FIGS. 11 and 12 show the same values for PV5 and PV6, having the reference back sheets noted in Table 2. Although both pass IEC 61215 after 1000 h of Damp Heat, PV6 ultimately fails, showing gradual decrease of Pmpp that reaches −6.9% by the end of the 3000 h exposure. Indeed, the Rs of PV6 increases dramatically in the first 1000 h of testing alone (reaching +14%), then further steadily degrades to +28% by the end of the 3000 h test, indicating significant corrosion to the electrical lines (which likely contributes to the ultimate failure of Pmpp at 3000 h). In addition, PV5 shows fairly consistent Pmpp and Rs until 2000 h, at which point Pmpp begins to steadily decline, going from 0% to −1.5% in the last 1000 h of testing alone, while Rs sharply increases, going from +0.4% to +6.9% in the last 1000 h of testing alone. These trends indicate that the conventional back sheet of PV5 performs well at first, but is susceptible to a shorter life span in view of the accelerating decline in Pmpp.

To summarize, the values ΔPmpp, ΔIsc, and ΔRs after 3000 h Damp Heat for each mini PV module (TPV-based back sheet modules PV1-PV4, and conventional back sheet modules PV5 and PV6) are also shown below in Table 4.

TABLE 4

Electrical Properties After 3000 h D-H Exposure

| Sample No. | Δ Pmpp | ΔIsc | Δ Rs |
|---|---|---|---|
| PV1 | −2.1% | −1.5% | +2.4% |
| PV2 | −1.8% | +0.3% | +3.5% |
| PV3 | −1.5% | −0.1% | +1.8% |

TABLE 4-continued

Electrical Properties After 3000 h D-H Exposure

| Sample No. | Δ Pmpp | ΔIsc | Δ Rs |
|---|---|---|---|
| PV4 | −2.9% | −1.2% | +4.7% |
| PV5 | −1.5% | +0.5% | +6.9% |
| PV6 | −6.9% | −1.5% | +28.0% |

Example 3-3

Electroluminescence (EL) of each 2-cell PV mini module was also recorded in images at 0 h, 1000 h, 2000 h, and 3000 h of Damp Heat exposure, and is shown in FIGS. 13-18, respectively.

Figure 13:
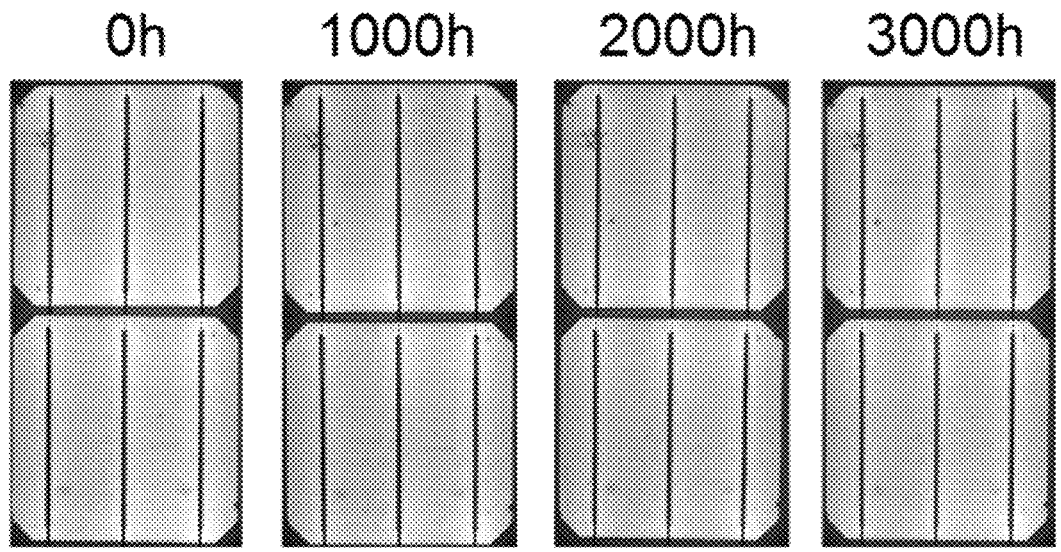
FIG. 13 is an image illustrating electroluminescence of PV cells in a test PV module at different times of exposure to Damp Heat conditions.

FIG. 13 shows no significant change in the EL of PV1, coinciding with the results of Example 3-2 that there is only slight degradation in the electrical performance of the module.

Figure 14:
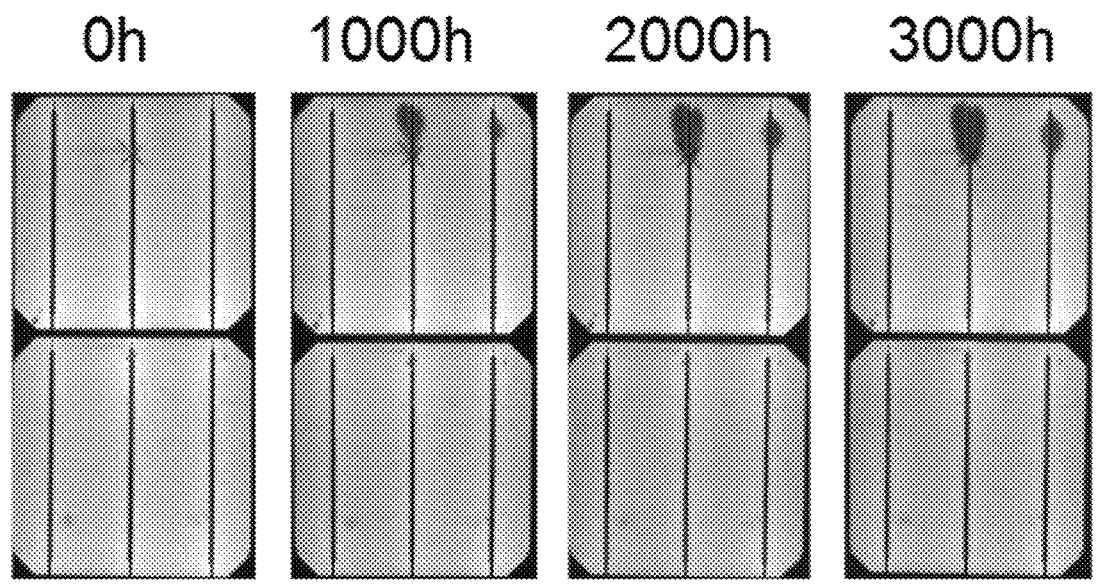
FIG. 14 is an image illustrating electroluminescence of PV cells in a test PV module at different times of exposure to Damp Heat conditions.

FIG. 14 shows that during 500-3000 h, 2 dark spots develop gradually on the upper cell of PV2, possibly due to the breakdown (and eventual rupture) of the back sheet, or corrosion of the aluminum paste at the cell back.

Figure 15:
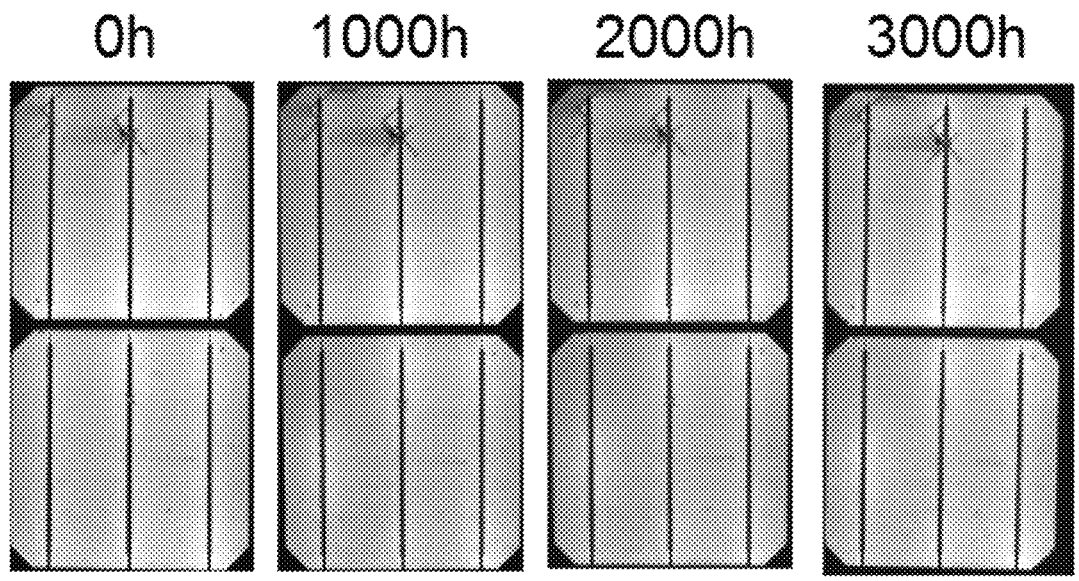
FIG. 15 is an image illustrating electroluminescence of PV cells in a test PV module at different times of exposure to Damp Heat conditions.

FIG. 15 shows a few dark strips growing in the upper portion of the top cell of PV3. One can also see a crack in the top left, which occurred on the glass front sheet during module fabrication. It is possible that the crack resulted in the localized loss of EL, and possibly could also have contributed to the corrosion indicated by increased Rs after 1000 h for PV3.

Figure 10:
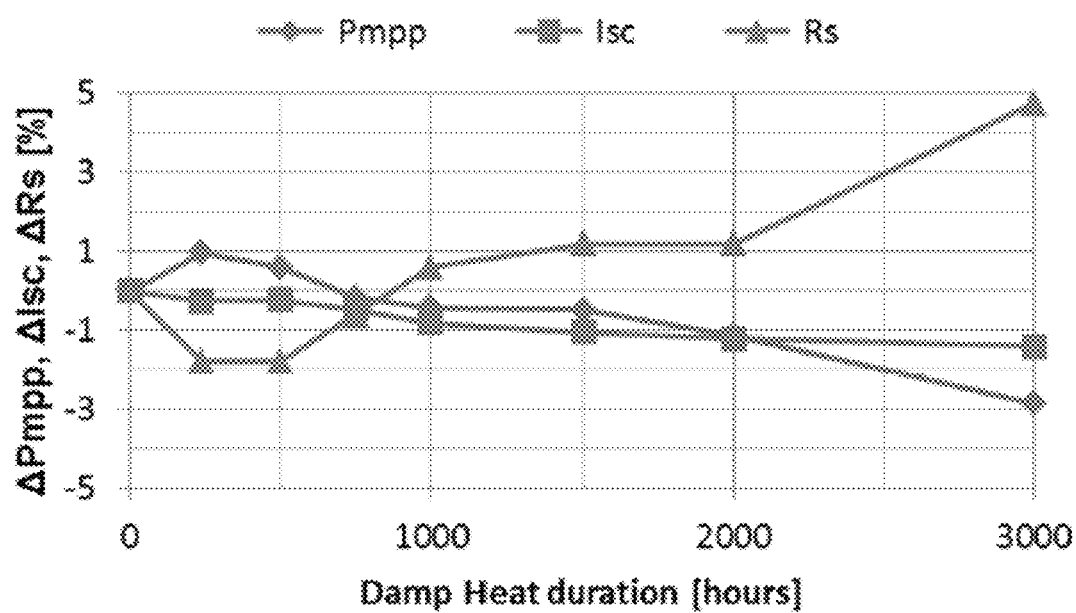
FIG. 10 is a graph illustrating changes in electrical properties of a test PV module as a function of time of exposure to Damp Heat conditions.
Figure 16:
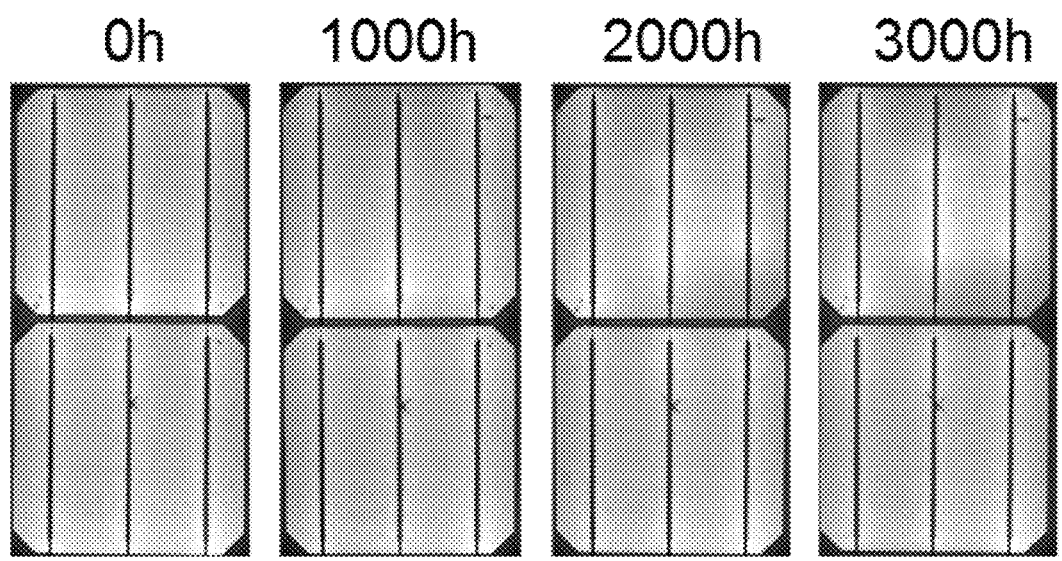
FIG. 16 is an image illustrating electroluminescence of PV cells in a test PV module at different times of exposure to Damp Heat conditions.

FIG. 16 shows no significant change in the EL of PV4 after 1000 h, with some minor darkening spots developing in the bottom portion of the top cell from 2000-3000 h, which coincides with the degradation of Rs of PV4 shown in Table 4 and FIG. 10.

Figure 17:
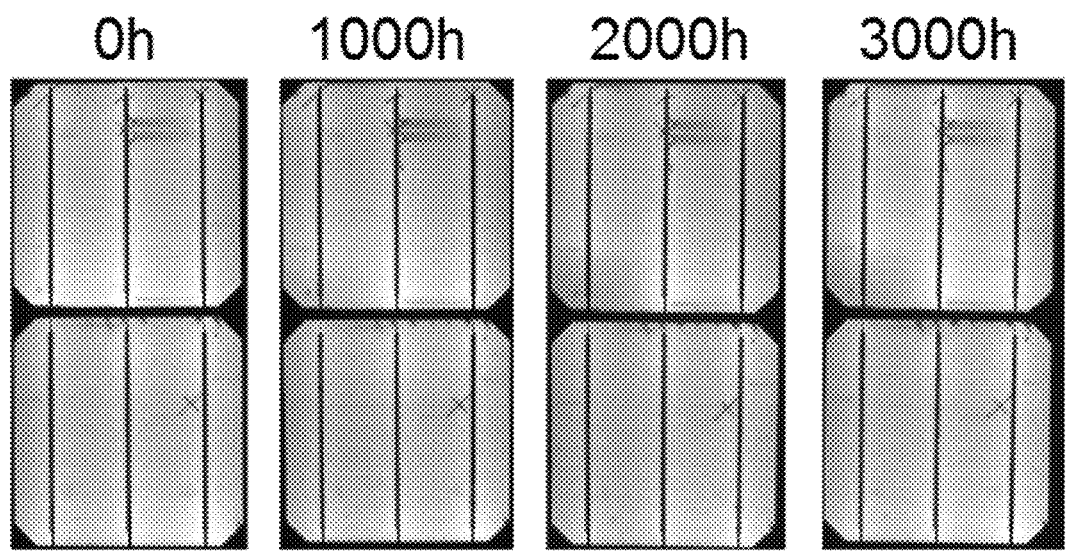
FIG. 17 is an image illustrating electroluminescence of PV cells in a test PV module at different times of exposure to Damp Heat conditions.

FIG. 17 similarly shows no significant change in the EL of PV5 after 1000 h, but dark spots develop on bottom left of the top cell thereafter, coinciding with the degradation in Rs for PV5 shown in Table 4 and FIG. 11.

Figure 18:
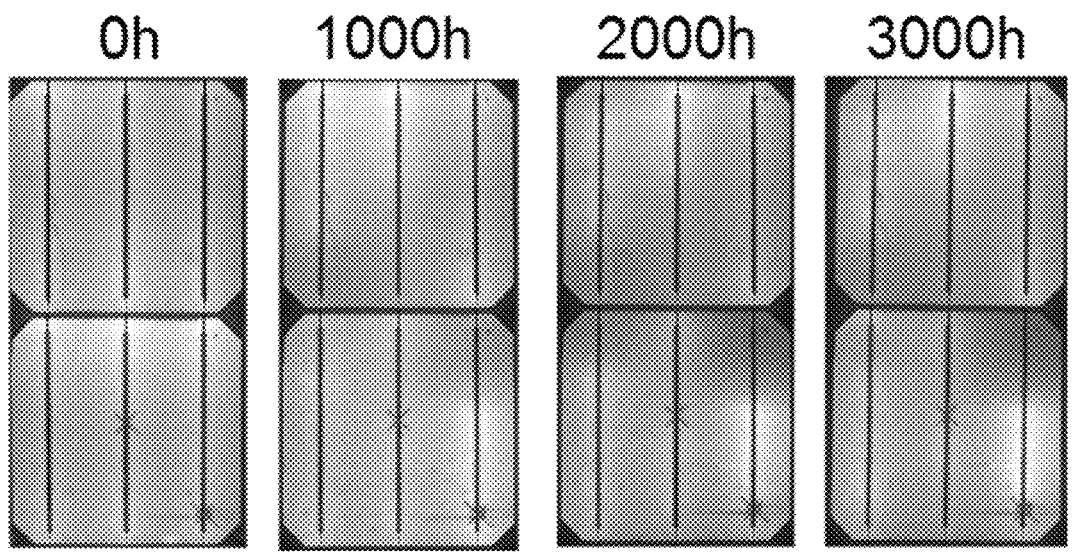
FIG. 18 is an image illustrating electroluminescence of PV cells in a test PV module at different times of exposure to Damp Heat conditions.

FIG. 18 shows dramatic darkening on both cells, indicating much less EL for PV6 throughout the duration of the test. This coincides with the dramatic increase of Rs in PV6, shown in Table 4 and FIG. 12. However, the image of FIG. 18 indicates that the loss in EL may be due to corrosion of Al paste at the cell back, rather than moisture ingress through the back sheet, as the latter would typically display darkening around cell edges that gradually diffuses to the center of the cell (e.g., as moisture gradually diffuses from the edges to the cell center). On the other hand, since the same paste was used in each PV module (and each module subjected to the same conditions), it can nonetheless be noted that the TPV-based back sheets in general did not exhibit such significant corrosion and degradation of the paste. That is, whatever the cause of performance degradation, the only variable among the modules tested (aside from accidental glass cracking in PV3, noted above) was the type of back sheet employed in each module.

Example 4

Five back sheets of varying thickness were fabricated and subjected to partial discharge (PD) testing. Partial discharge refers to a localized dielectric breakdown in the back sheet, and which does not bridge the space between two conductors. Desirably, a back sheet provides electrical insulation, and therefore should exhibit as high a maximum permissible system voltage as possible, without allowing any partial discharge across the back sheet.

The PD testing was carried out according to EN 61730: 2007. The measuring method of $U_i$ (inception voltage of partial discharge) and $U_e$ (extinction voltage of partial discharge) was as follows: first increased voltage to $U_i$, then waited 5 seconds and further increased another 10%, then waited another 5 seconds. Then, voltage was dropped to $U_e$ with a voltage ramp-down at 20 V/s. $U_e$ must be partial discharge free for 60 s. Extinction voltage is considered to be reached if the PD-strength drops below 1 pC in a time of 60 seconds.

PD-strength was evaluated according to IEC 60243-1 (standardized testing to determine electric strength of solid insulating materials), by placing each one of ten samples of each type of back sheet between two test electrodes (25 mm/75 mm diameter) in succession. Impedance was measured on the grounding side of the test specimen. Standard IEC 60664-1:2007 was followed for insulation coordination for the testing equipment. The tests were carried out at 37% relative humidity, and room temperature (varying throughout the tests in this case from 21° C.-24.5° C.).

The extinction voltages from each of the 10 tests (1 on each of the 10 samples of each type of back sheet) were recorded for each sample back sheet, and mean extinction voltages and experimental standard deviations were calculated for each type of sample. Further, a maximum permissible system voltage ($U_{max}$) for each back sheet was determined on the basis of IEC 60664-1: $U_{max} = U_e \times 1.414/(1.2 \times 1.25)$, where $U_e$ is determined for each sample type as the calculated mean extinction voltage minus the experimental standard deviation, 1.414 is calculation of the peak voltage value for the system, 1.2 represents a safety factor (accounting for variations in environmental conditions such as humidity and temperature), and 1.25 represents an additional safety factor (applied per IEC 60664-1 for intensified insulation).

Finally, it is noted that extinction voltage (and therefore maximum permissible system voltage) is dependent upon thickness of the back sheet. Therefore, average thickness of each back sheet was determined by measuring thickness at the center of each rectangular back sheet sample, as well as at each of the four corners of each sample. The mean of the five thickness measurements was taken as the average thickness. Table 5 below lists the mean extinction voltages, max permissible system voltages, and thickness for each of the five back sheet types tested.

TABLE 5

Partial Discharge Test Results

| Back Sheet Material | Avg Thickness | $U_e$ (mean) | Exp. Std. Dev. | $U_{max}$ |
|---|---|---|---|---|
| ICOSOLAR ™ 2442 | 0.360 mm | 1133 V | 75 V | 997 VDC |
| SANTOPRENE ™ TPV 101-55 | 0.299 mm | 1167 V | 67 V | 1037 VDC |
| SANTOPRENE ™ TPV 101-80 | 0.994 mm | 2368 V | 59 V | 2176 VDC |
| SANTOPRENE ™ TPV 251-80W232 | 0.559 mm | 1764 V | 145 V | 1526 VDC |
| SANTOPRENE ™ TPV 101-80 | 0.287 mm | 1177 V | 84 V | 1031 VDC |

Interestingly, although the reference ICOSOLAR sheet is 0.360 mm thick, it exhibits slightly lower max permissible voltage than the even thinner back sheets made from SANTOPRENE™ TPV 101-80 and 101-55, indicating substantial benefits in the electrical insulation properties of TPV-based back sheets, particularly at thickness of about 0.35 mm or less, or even 0.3 mm or less.

While the present invention has been described and illustrated by reference to particular embodiments, those of ordinary skill in the art will appreciate that the invention lends itself to variations not necessarily illustrated herein. For this reason, then, reference should be made solely to the appended claims for purposes of determining the true scope of the present invention. All documents described herein are incorporated by reference herein, including any priority documents and/or testing procedures to the extent they are not inconsistent with this text. Likewise, the term "comprising" is considered synonymous with the term "including." Whenever a composition, an element or a group of elements is preceded with the transitional phrase "comprising," it is understood that—unless the context plainly dictates otherwise—we also contemplate the same composition or group of elements with transitional phrases "consisting essentially of," "consisting of," "selected from the group of consisting of," or "is" preceding the recitation of the composition, element, or elements and vice versa.

We claim:

1. A photovoltaic module comprising:
   one or more photovoltaic cells at least partially encapsulated in a multilayer composite consisting of (i) a first layer consisting essentially of a thermoplastic vulcanizate and (ii) a second layer comprising an at least partially crosslinked polymeric composition;
   wherein the thermoplastic vulcanizate comprises an at least partially vulcanized rubber dispersed in a continuous thermoplastic matrix, and further wherein the thermoplastic vulcanizate has one or both of the following properties: hardness of at least 55 Shore A, and M100 within the range from 1 to 15 MPa.

2. The photovoltaic module of claim 1, wherein the at least partially crosslinked polymeric composition is selected from the group consisting of ionomers, thermoplastic poly urethanes (TPUs), polyvinyl butyral (PVB), polydimethyl-silicone (PDMS), ethyl vinyl acetate (EVA), and combinations thereof.

3. The photovoltaic module of claim 1, wherein a front side of each of the one or more photovoltaic cells is not encapsulated in the multilayer composite, and further wherein the front side of each photovoltaic cell is covered by a front encapsulant comprising a polymeric material selected from the group consisting of ionomers, thermoplastic poly urethanes (TPUs), polyvinyl butyral (PVB), polydimethyl-silicone (PDMS), ethyl vinyl acetate (EVA), and combinations thereof.

4. The photovoltaic module of claim 1, wherein the multilayer composite has average thickness ranging from 0.1 mm to 1.5 mm.

5. The photovoltaic module of claim 1, wherein less than 10 wt % of the at least partially vulcanized rubber is extractable from the thermoplastic vulcanizate in boiling xylene.

6. The photovoltaic module of claim 1, wherein the TPV comprises oil and wherein at least 90 wt % of the oil in the TPV has Saybolt color value within the range from +20 to +30, as determined by ASTM D156.

7. The photovoltaic module of claim 1, wherein the at least partially vulcanized rubber of the thermoplastic vulcanizate comprises an ethylene-propylene-diene (EPDM) rubber; and further wherein the continuous thermoplastic matrix comprises polypropylene.

8. The photovoltaic module of claim 1, wherein the thermoplastic vulcanizate comprises one or more of UV stabilizers and functionalized polymers.

* * * * *